United States Patent
Gardner et al.

(10) Patent No.: US 11,764,200 B2
(45) Date of Patent: Sep. 19, 2023

(54) HIGH DENSITY ARCHITECTURE DESIGN FOR 3D LOGIC AND 3D MEMORY CIRCUITS

(71) Applicant: Tokyo Electron Limited, Tokyo (JP)

(72) Inventors: Mark Gardner, Cedar Creek, TX (US); H. Jim Fulford, Marianna, FL (US)

(73) Assignee: Tokyo Electron Limited, Tokyo (JP)

( * ) Notice: Subject to any disclaimer, the term of this patent is extended or adjusted under 35 U.S.C. 154(b) by 4 days.

(21) Appl. No.: 17/652,864

(22) Filed: Feb. 28, 2022

(65) Prior Publication Data

US 2022/0181315 A1  Jun. 9, 2022

Related U.S. Application Data

(63) Continuation of application No. 16/997,525, filed on Aug. 19, 2020, now Pat. No. 11,282,828.

(60) Provisional application No. 62/978,951, filed on Feb. 20, 2020.

(51) Int. Cl.
| | |
|---|---|
| *H01L 25/00* | (2006.01) |
| *H01L 25/065* | (2023.01) |
| *H01L 25/18* | (2023.01) |
| *H10B 10/00* | (2023.01) |
| *H10B 69/00* | (2023.01) |

(52) U.S. Cl.
CPC .......... *H01L 25/50* (2013.01); *H01L 25/0657* (2013.01); *H01L 25/18* (2013.01); *H10B 10/18* (2023.02); *H10B 69/00* (2023.02)

(58) Field of Classification Search
CPC ..... H01L 25/50; H01L 25/0657; H01L 25/18; H10B 10/12; H10B 69/00
See application file for complete search history.

(56) References Cited

U.S. PATENT DOCUMENTS

| | | | |
|---|---|---|---|
| 10,283,452 B2 | 5/2019 | Zhu et al. | |
| 10,297,578 B2 | 5/2019 | Tagami et al. | |
| 10,651,153 B2 | 5/2020 | Fastow et al. | |
| 10,741,527 B2 | 8/2020 | Tagami et al. | |
| 10,867,678 B2 | 12/2020 | Chen et al. | |
| 11,631,671 B2 * | 4/2023 | Fulford | H01L 27/0922 257/288 |
| 2018/0261575 A1 | 9/2018 | Tagami et al. | |
| 2018/0366409 A1 | 12/2018 | Kuwabara | |
| 2019/0043836 A1 | 2/2019 | Fastow et al. | |
| 2019/0088589 A1 | 3/2019 | Zhu et al. | |
| 2019/0244892 A1 | 8/2019 | Zhu et al. | |

(Continued)

FOREIGN PATENT DOCUMENTS

CN   110192269 A   8/2019

OTHER PUBLICATIONS

International Search Report and Written Opinion of the International Searching Authority dated Mar. 22, 2021 in PCT/US2020/062848, 11 pages.

*Primary Examiner* — Thao P Le
(74) *Attorney, Agent, or Firm* — Oblon, McClelland, Maier & Neustadt, L.L.P.

(57) ABSTRACT

Techniques herein include methods of forming higher density circuits by combining multiple substrates via stacking and bonding of individual substrates. High voltage and low voltage devices along with 3D NAND devises are fabricated on a first wafer, and high voltage and low voltage devices and/or memory are then fabricated on a second wafer and/or third wafer.

20 Claims, 38 Drawing Sheets

(56) References Cited

U.S. PATENT DOCUMENTS

| | | |
|---|---|---|
| 2019/0244893 A1 | 8/2019 | Zhu et al. |
| 2019/0312012 A1 | 10/2019 | Tagami et al. |
| 2019/0363079 A1 | 11/2019 | Thei |
| 2020/0027509 A1 | 1/2020 | Chen et al. |
| 2020/0279841 A1 | 9/2020 | Sanuki |
| 2020/0328176 A1 | 10/2020 | Liu |
| 2020/0328180 A1 | 10/2020 | Liu |
| 2020/0328186 A1 | 10/2020 | Liu |
| 2020/0328188 A1 | 10/2020 | Liu |
| 2020/0328190 A1 | 10/2020 | Liu |
| 2020/0350014 A1 | 11/2020 | Liu |
| 2020/0350286 A1 | 11/2020 | Liu |
| 2020/0350287 A1 | 11/2020 | Liu |
| 2020/0350291 A1 | 11/2020 | Tagami et al. |
| 2020/0350320 A1 | 11/2020 | Liu |
| 2020/0350321 A1 | 11/2020 | Liu |
| 2020/0350322 A1 | 11/2020 | Liu |
| 2021/0175327 A1 | 6/2021 | Fulford |
| 2021/0217666 A1 | 7/2021 | Fulford |
| 2021/0249430 A1 | 8/2021 | Fulford |
| 2021/0265254 A1 | 8/2021 | Bhattacherjee |
| 2021/0265333 A1 | 8/2021 | Gardner |
| 2021/0313327 A1 | 10/2021 | Gardner |
| 2021/0323054 A1 | 10/2021 | Gibson |
| 2021/0343714 A1 | 11/2021 | Gardner |
| 2022/0328474 A1* | 10/2022 | Or-Bach ................ H10B 43/20 |
| 2022/0336252 A1* | 10/2022 | Or-Bach ................ H01L 29/78 |
| 2023/0019049 A1* | 1/2023 | Or-Bach ............. H01L 21/6835 |
| 2023/0068842 A1* | 3/2023 | Seo .................... H01L 23/5385 |
| 2023/0072616 A1* | 3/2023 | Yoon ....................... H01L 24/73 |
| 2023/0074317 A1* | 3/2023 | Kim .................... H01L 23/5228 |
| 2023/0097021 A1* | 3/2023 | Kwon .................... H10B 43/40 |
| | | 257/324 |

* cited by examiner

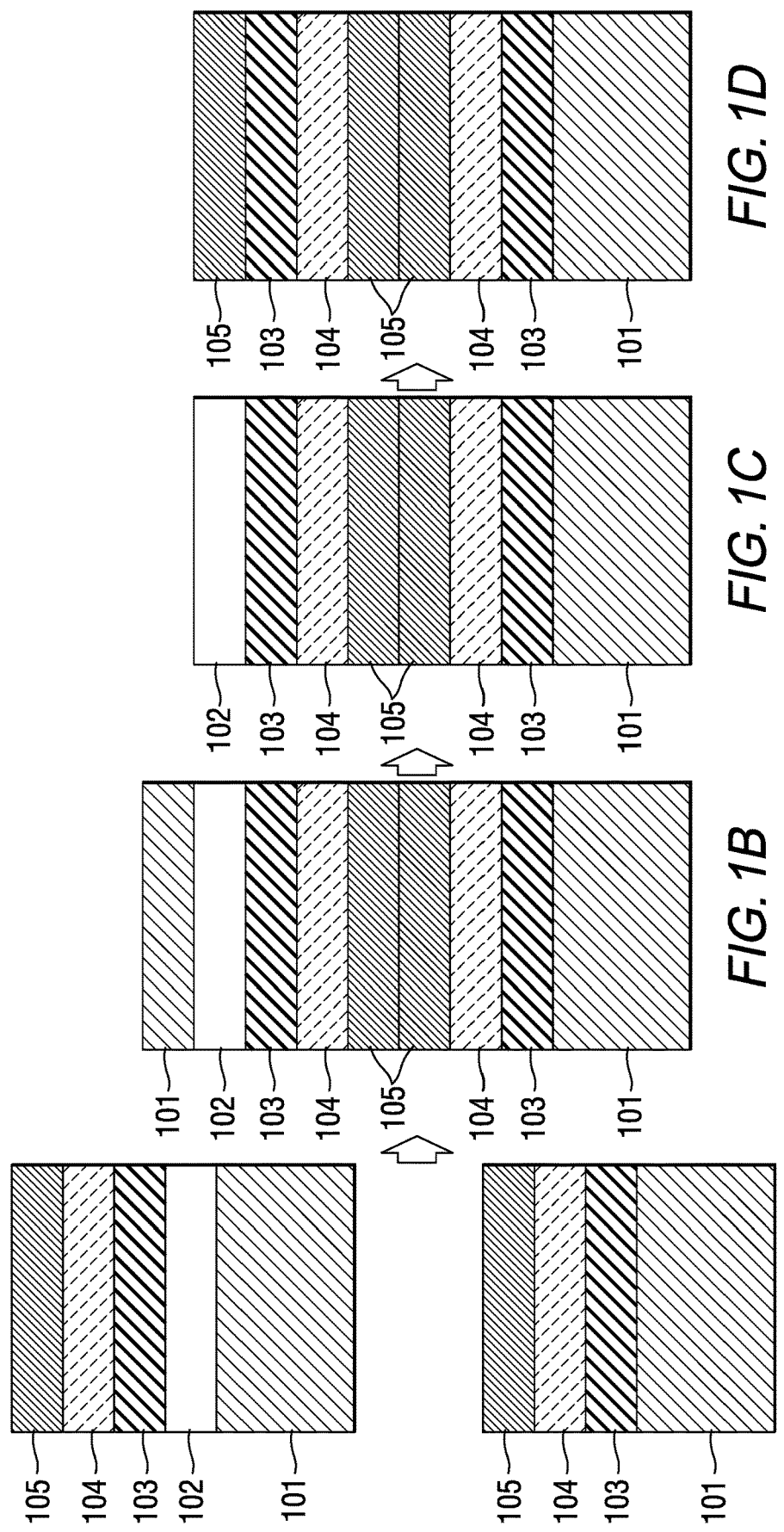

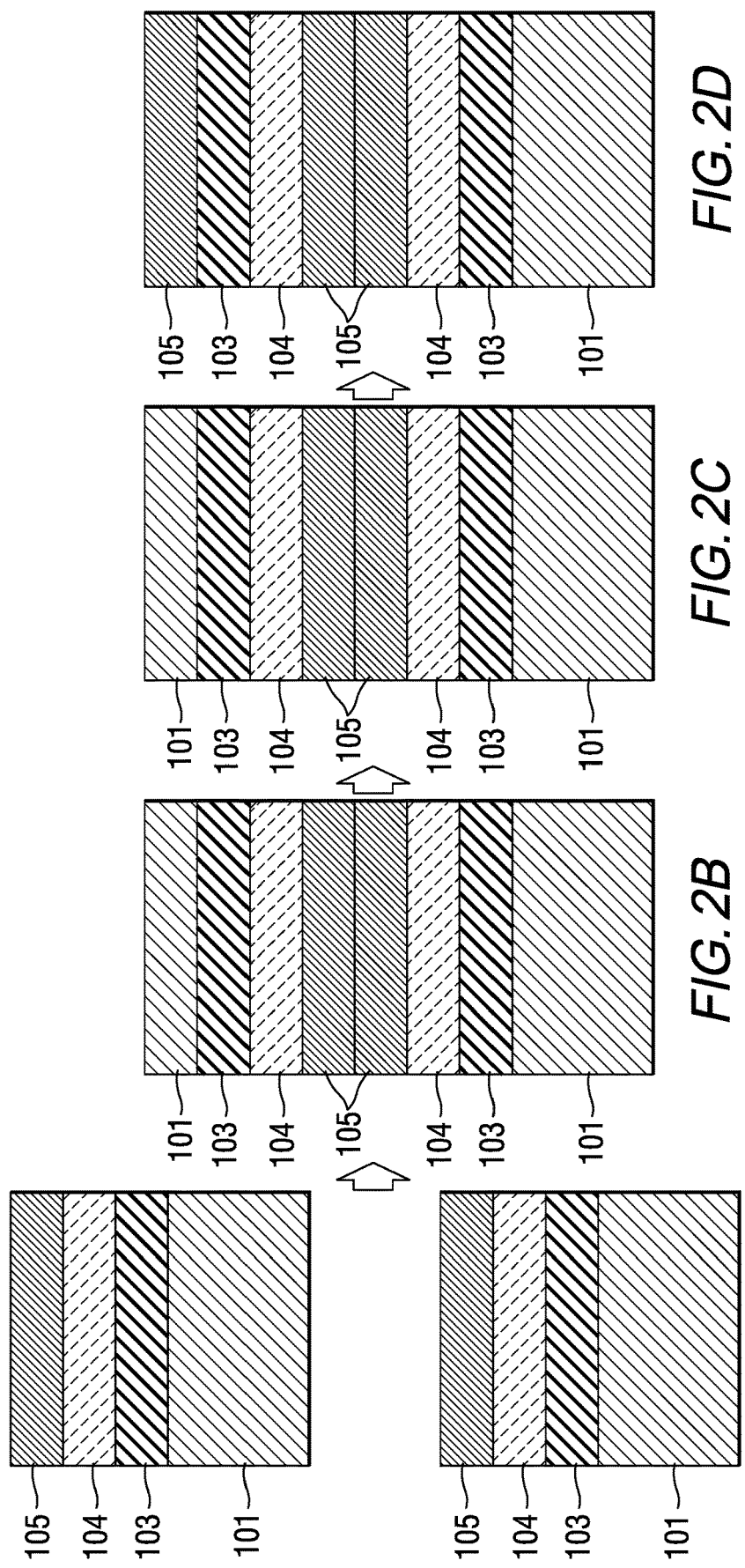

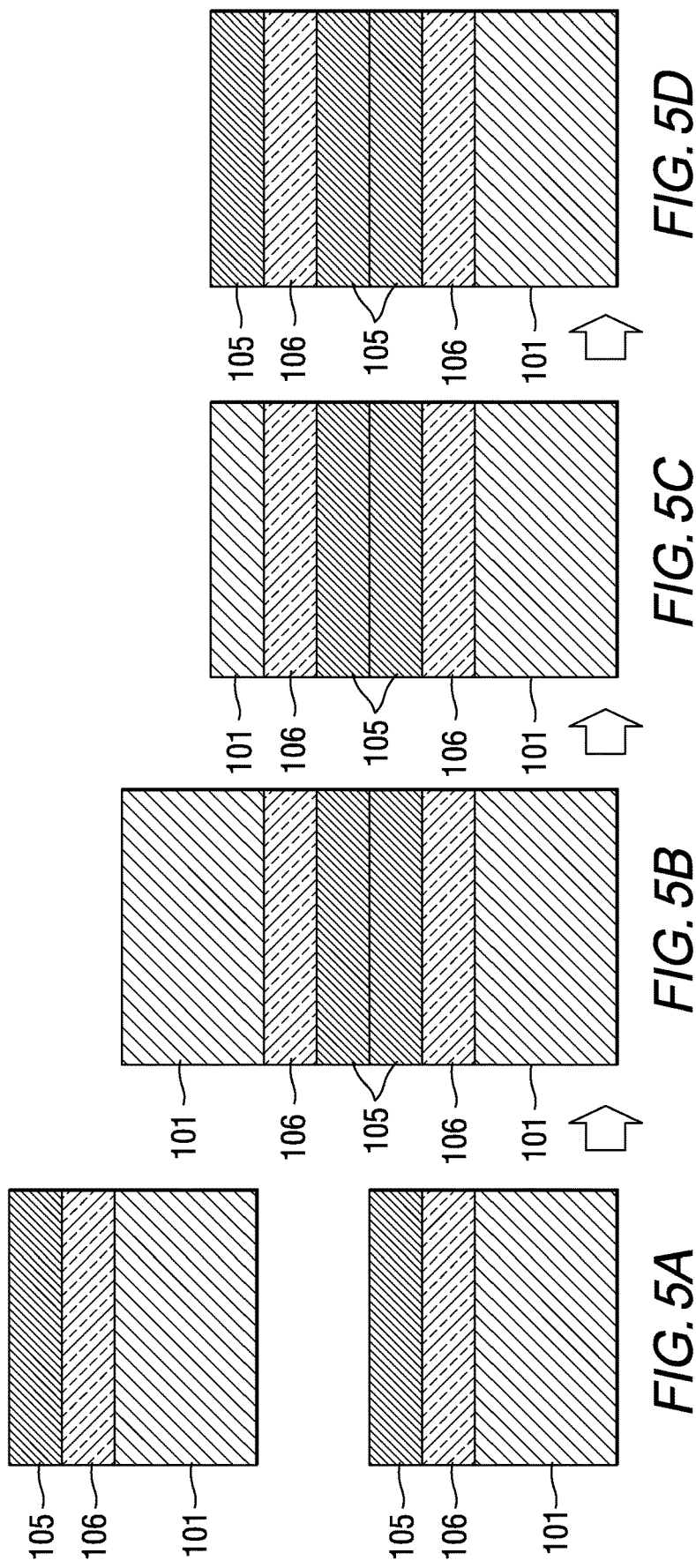

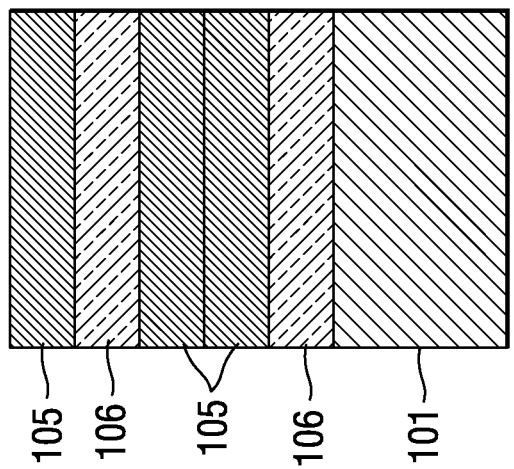
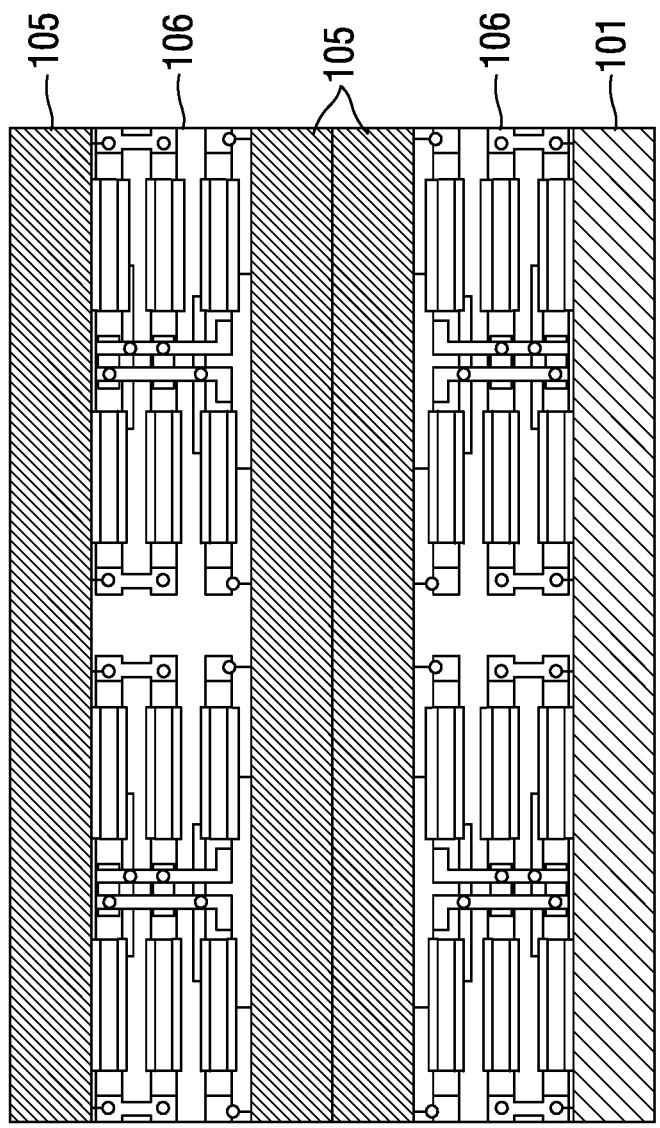

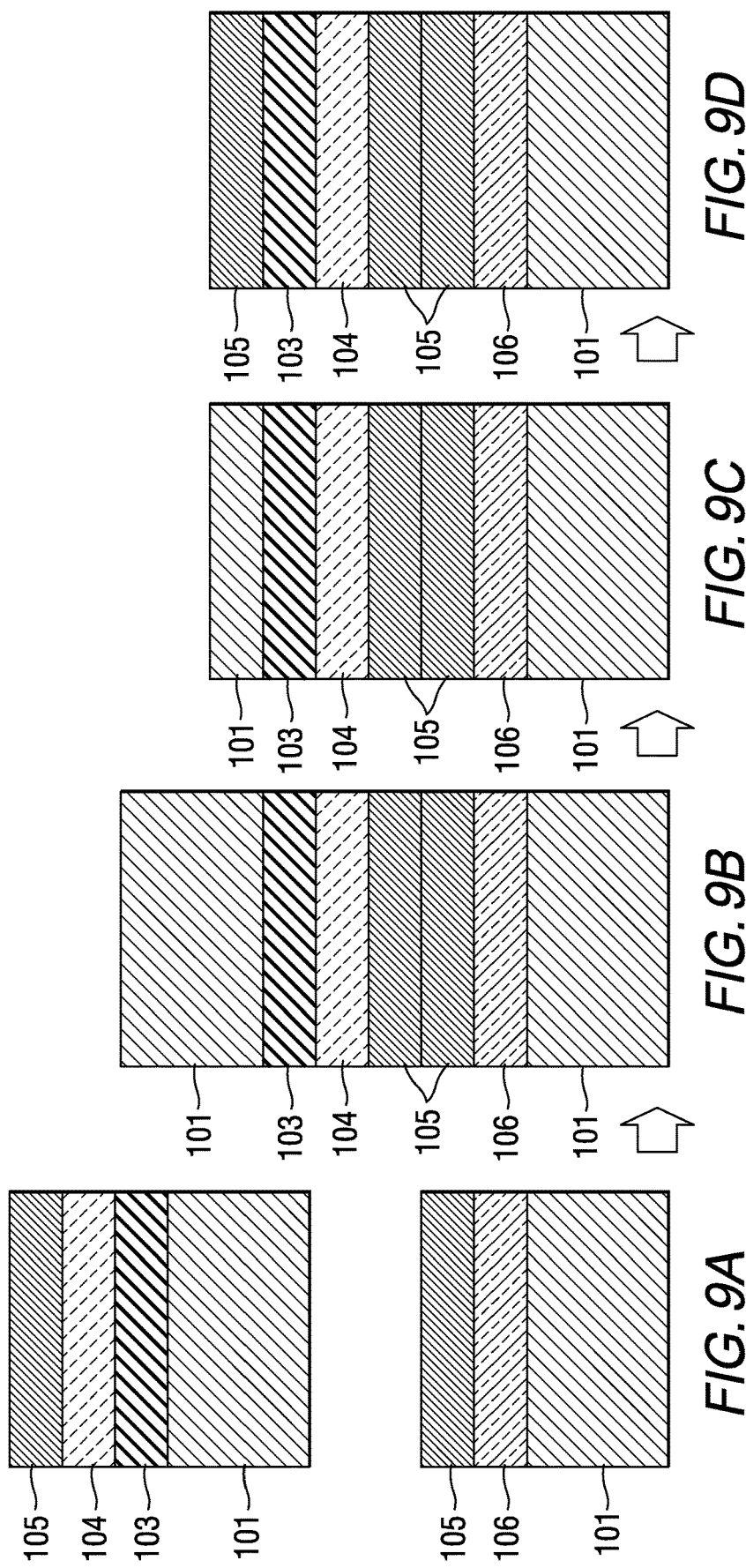

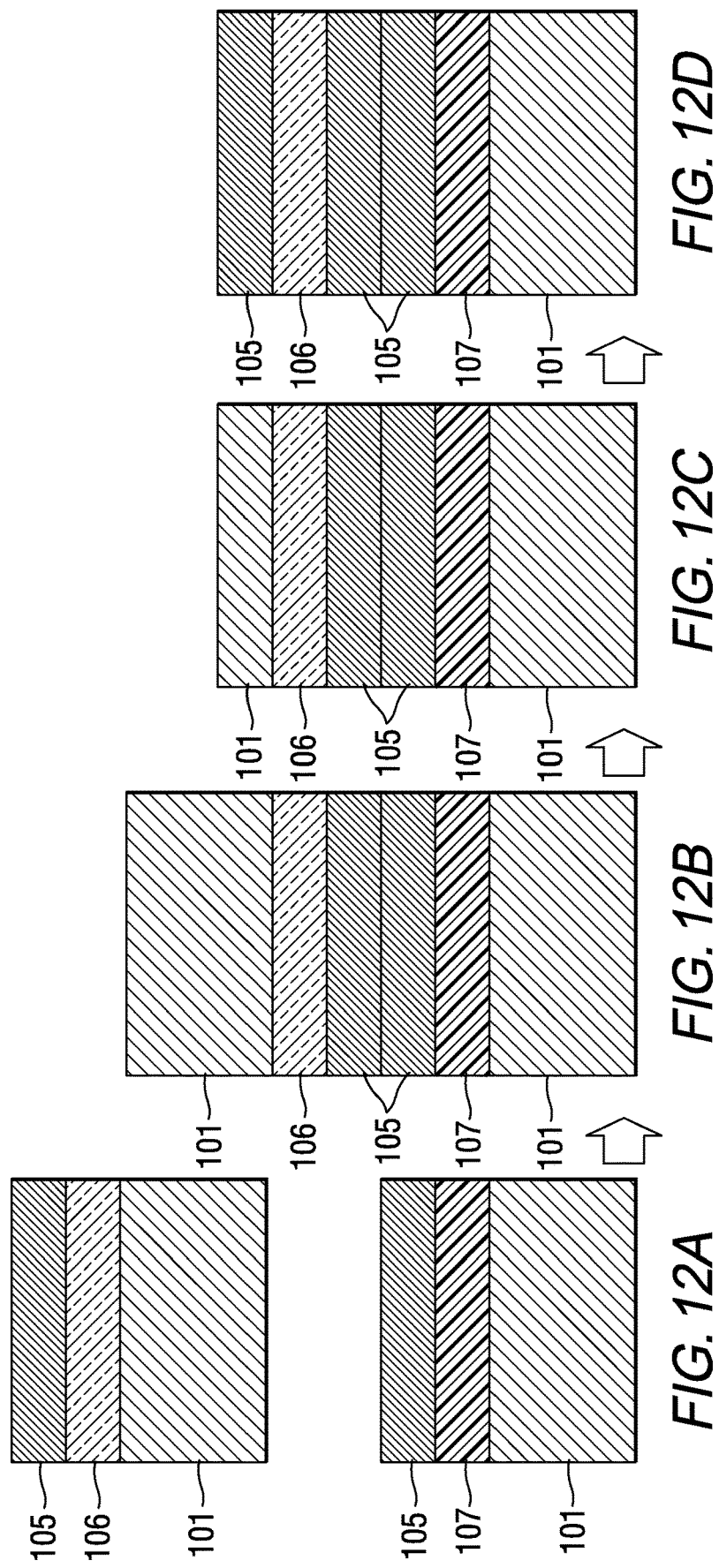

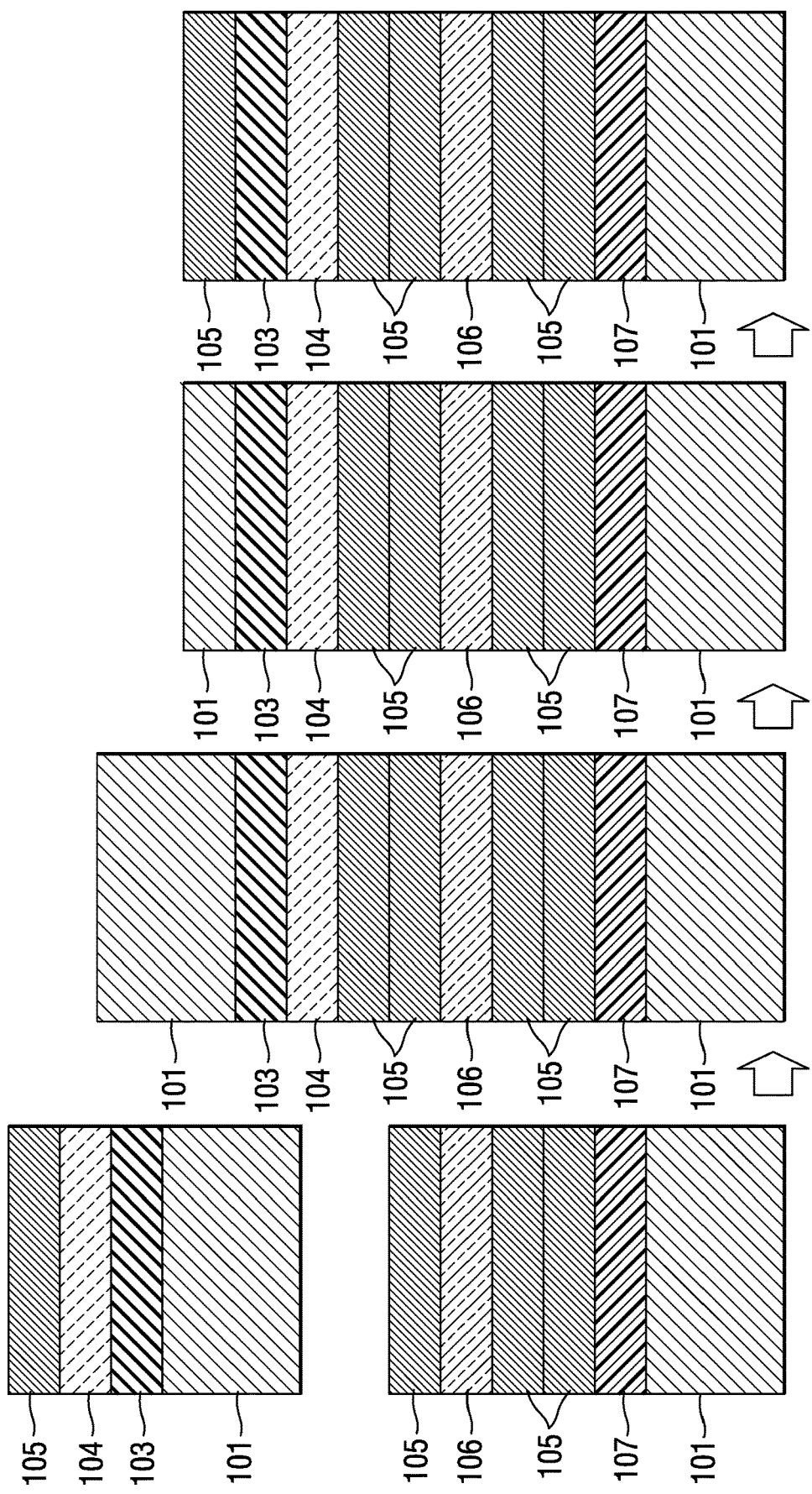

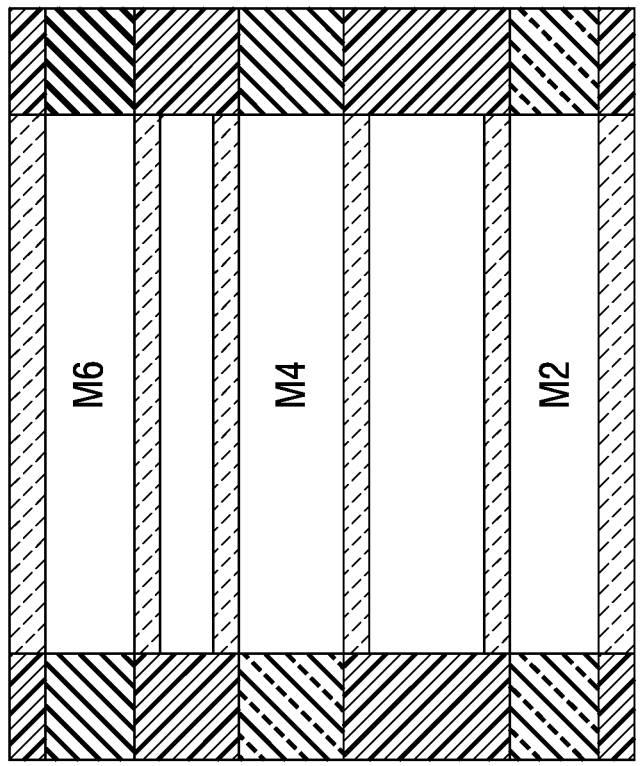
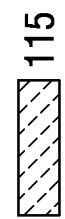
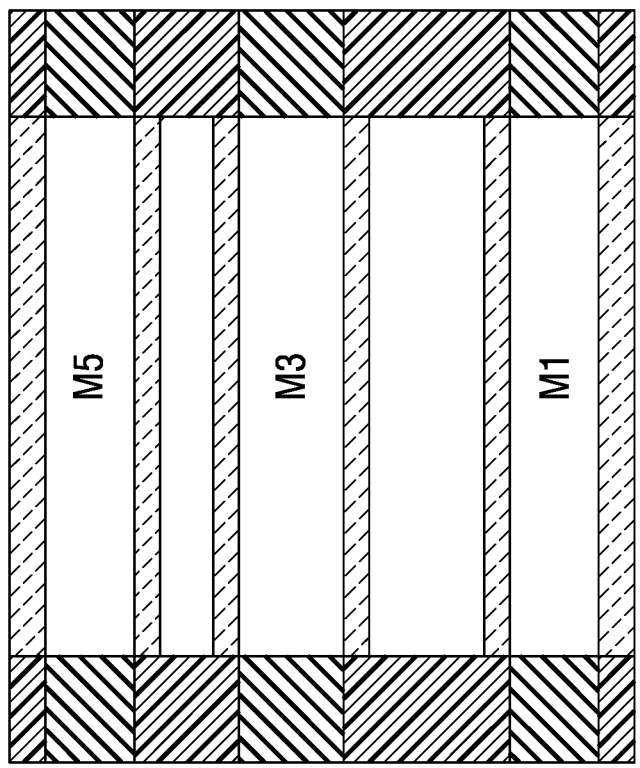
FIG. 18

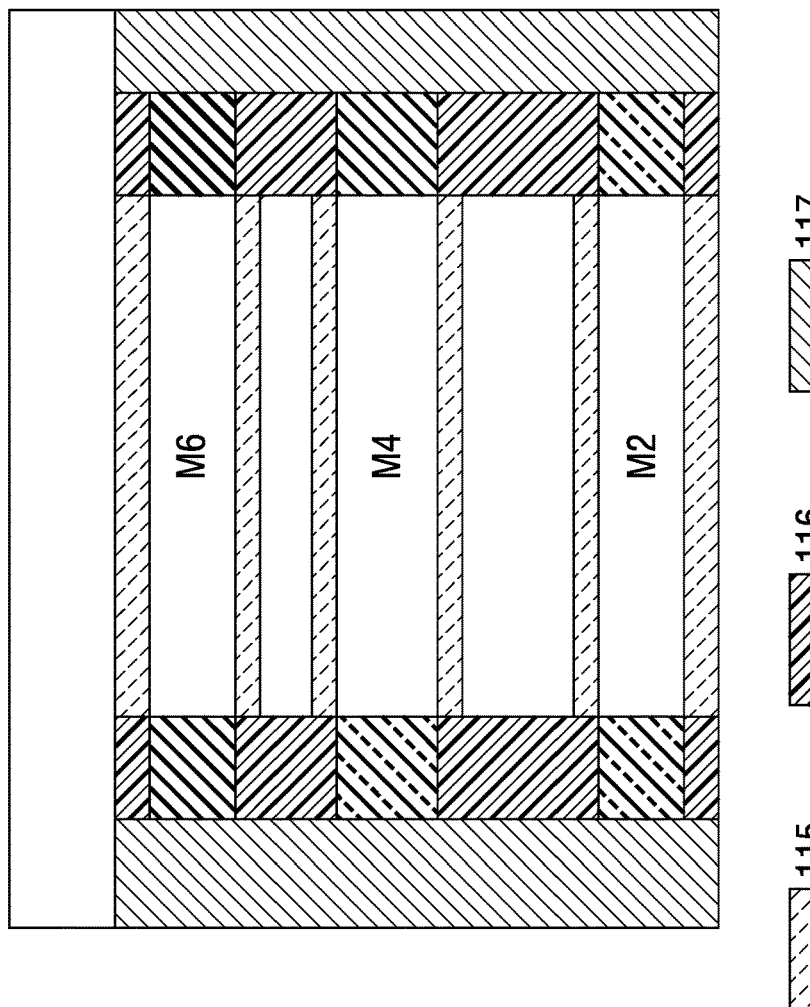
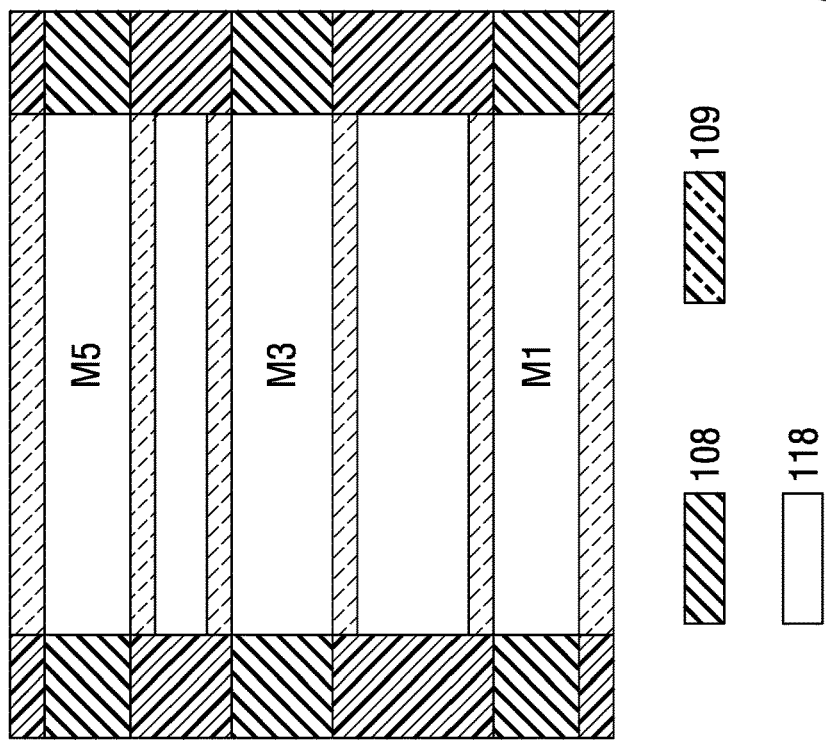
FIG. 20

HIGH DENSITY ARCHITECTURE DESIGN FOR 3D LOGIC AND 3D MEMORY CIRCUITS

CROSS REFERENCE TO RELATED APPLICATIONS

This application is a continuation of application Ser. No. 16/997,525, filed Aug. 19, 2020, which is based on and claims the benefit of and priority to U.S. Provisional Patent Application No. 62/978,951, entitled "HIGH DENSITY ARCHITECTURE DESIGN FOR 3D LOGIC AND 3D MEMORY CIRCUITS", filed on Feb. 20, 2020, the entire contents of which are herein incorporated by reference.

BACKGROUND

Technical Field

This disclosure relates to integrated circuits and the fabrication of microelectronic devices.

Description Of The Related Art

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

3D integration is seen as a viable option to continue semiconductor scaling in spite of inevitable saturation in critical dimension scaling. As the contacted gate pitch reaches its scaling limit due to manufacturing variability and electrostatic device limitations, 2D transistor density scaling stops. Even experimental new transistor designs, such as vertical channel gate-all-around transistors, that may be able to one day overcome these contacted gate pitch scaling limits, do not promise to get semiconductor scaling back on track because resistance, capacitance, and reliability concerns limit wire pitch scaling, thereby limiting the density with which transistors can be wired into circuits.

3D integration, i.e. the vertical stacking of multiple devices, aims to overcome these scaling limitations by increasing transistor density in volume rather than area. This idea has been successfully demonstrated and implemented by the flash memory industry with the adoption of 3D NAND. Mainstream CMOS VLSI scaling, as used for example in Central Processing Unit (CPU) or Graphics Processing Unit (GPU) products, is exploring adoption of 3D integration as a primary means of moving the semiconductor roadmap forward, and thus desires enabling technologies.

SUMMARY

Techniques described herein provide methods of fabricating higher density circuits at reduced costs. Higher density circuits are achieved by stacking and bonding of individual substrates. For example, techniques herein enable 3D NAND to increase memory density by 2 to 4 times by bonding wafers. Likewise, 3D Static Random Access Memory (SRAM) can increase memory density by 2 to 4 times with wafer bonding. Techniques and designs herein also increase circuit speed and performance because memory elements and circuit elements are in close proximity.

Embodiments include providing a method to make a two to four times increase of combined memory of SRAM plus 3D NAND. Many applications use multiple memory types. Another embodiment includes a combination microprocessor (CPU+LOGIC+SRAM) as well as 3D NAND and 3D SRAM on different wafers for high speed computing. This techniques enable multiple cores on multiple 3D planes.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present embodiments can be viewed in many different ways.

This summary section does not specify every embodiment and/or incrementally novel aspect of the present disclosure or claimed features. Instead, this summary only provides a preliminary discussion of different embodiments and corresponding points of novelty over conventional techniques. For additional details and/or possible perspectives of the embodiments, the reader is directed to the Detailed Description section and corresponding figures of the present disclosure as further discussed below.

BRIEF DESCRIPTION OF THE DRAWINGS

The application will be better understood in light of the description which is given in a non-limiting manner, accompanied by the attached drawings in which:

FIGS. 1A-1D show a schematic of a flow process of combining two substrates

FIGS. 2A-2D show a schematic of another flow process of combining two substrates FIGS. 5A-5D show a schematic of another flow process of combining two substrates FIGS. 6A-6B show a schematic of a cross section of the device of FIG. 5D FIGS. 7A-7B show a schematic of a stacking of substrates with increased memory density FIGS. 9A-9D show a schematic of another flow process of combining two substrates FIGS. 12A-12D show a schematic of another flow process of combining two substrates FIGS. 14A-14D show a schematic of a flow process of combining three substrates FIGS. 17-34 show a schematic of a flow process for forming a grown silicon connection with SRAM access transistors on top

DETAILED DESCRIPTION OF THE PREFERRED EMBODIMENTS

Figure 3B:
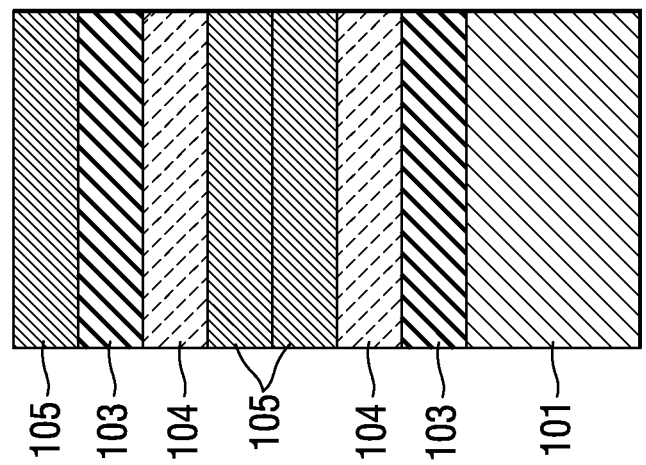
FIGS. 3A-3B show a schematic of a cross section of the device of FIG. 2D FIGS. 4A-4B show a schematic of a stacking of substrates with increased memory density

Reference throughout this specification to "one embodiment" or "an embodiment" means that a particular feature, structure, material, or characteristic described in connection with the embodiment is included in at least one embodiment of the application, but do not denote that they are present in every embodiment.

Thus, the appearances of the phrases "in one embodiment" or "in an embodiment" in various places throughout this specification are not necessarily referring to the same embodiment of the application. Furthermore, the particular features, structures, materials, or characteristics may be combined in any suitable manner in one or more embodiments.

Techniques herein include methods of forming integrated circuits by combining multiple substrates. Each substrate can be processed/fabricated simultaneously and with processing parameters (such as temperature) optimized for respective devices being fabricated on each substrate. Techniques herein combine different substrates to get the maximum performance from each circuit block and from a combined substrate.

Bonding techniques and flow herein can include those described in U.S. Ser. No. 62/901,591, entitled "High Density Logic And Memory Formation For Advanced Circuit Architecture" filed on Sep. 17, 2019, as well as U.S. Ser. No. 16/592,519 entitled "Method of Making Multiple Nano layer transistors to enhance a multiple stack CFET performance" filed on Oct. 3, 2019, both of which are hereby incorporated by reference in their entirety.

Example embodiments herein will be described with reference to the accompanying drawings. Embodiments will show various process flows for combining different substrates together to achieve improved performance. As will be appreciated, many other stacking combinations are possible to achieve increased circuit speed and performance with memory and circuit elements in close proximity.

In FIGS. 1A to 1D, two substrates are combined. In FIG. 1A, the upper substrate 101 has a dielectric (such as silicon oxide) 102 deposited on bulk substrate material (such as silicon). On the dielectric 102, a plane of low-voltage (LV) devices and high-voltage (HV) devices 103 is fabricated. The plane of LV and HV devices 103 can include 3D devices, stacked devices, lateral gate-all-around devices, and so forth. On the plane of LV and HV devices 103 a plane of memory devices 104 is formed, where these memory devices 104 can include 3D NAND memory. On the plane of memory devices 104 a wiring plane 105 is formed. This wiring plane (Metal X routing) 105 can have one or multiple wiring levels. Wiring structures herein can be formed with conventional processes such as depositing oxide, using a photo mask to etch trenches and vias, adding contacts. The lower substrate of FIG. 1A has HV and LV devices 103 formed over substrate 101. Then memory devices 104 can be formed on the LV and HV devices 103 followed by a wiring plane 105 on this second substrate 101.

In FIG. 1B, the two substrates are aligned and joined at their respective metal wiring layers. Accordingly, one substrate is essentially flipped to make this alignment. After the substrates are bonded, the bulk material on one of the substrates can be grinded or polished until reaching the dielectric 102 (FIG. 1C). Then a third wiring plane 105 can be formed in this dielectric (FIG. 1D). Accordingly, a combined substrate is generated, and additional wiring and fabrication steps can be executed.

In the example embodiment of FIGS. 1A to 1D, only the first substrate includes oxide between the device plane and the bulk substrate material. Thus, the lower substrate in FIG. 1A has devices 103 formed directly on bulk substrate material 101, and can have memory devices 104 formed on the LV and HV devices 103. The first wafer is flipped and aligned with the second wafer, aligned and bonded at low temperature (FIG. 1B). Bulk substrate material 101 can be removed from the first substrate of the combined substrate, by grinding or polishing, until reaching the layer of dielectric 102. Then this uncovered layer of oxide can be converted into a metal routing layer (wiring plane) (FIG. 1D). This flow can double a density of existing 3D NAND technology, with a memory increase of 2 times to 5 times.

The example embodiment of FIGS. 2A to 2D is similar to FIGS. 1A to 1D, except that neither substrate in FIG. 2A has a layer of dielectric separating devices from the bulk substrate material. The first substrate is flipped, aligned, and bonded with the second substrate at low temperature (FIG. 2B). In FIG. 2C, the bulk substrate material of the first substrate is reduced in thickness, by removing bulk substrate material via grinding or polishing. In FIG. 2D, the remaining substrate material is converted to an oxide layer to form a wiring plane 105. The wiring plane is formed by conventional processes such as depositing oxide, using a photo mask to etch trenches and vias, adding contacts.

Figure 3A:
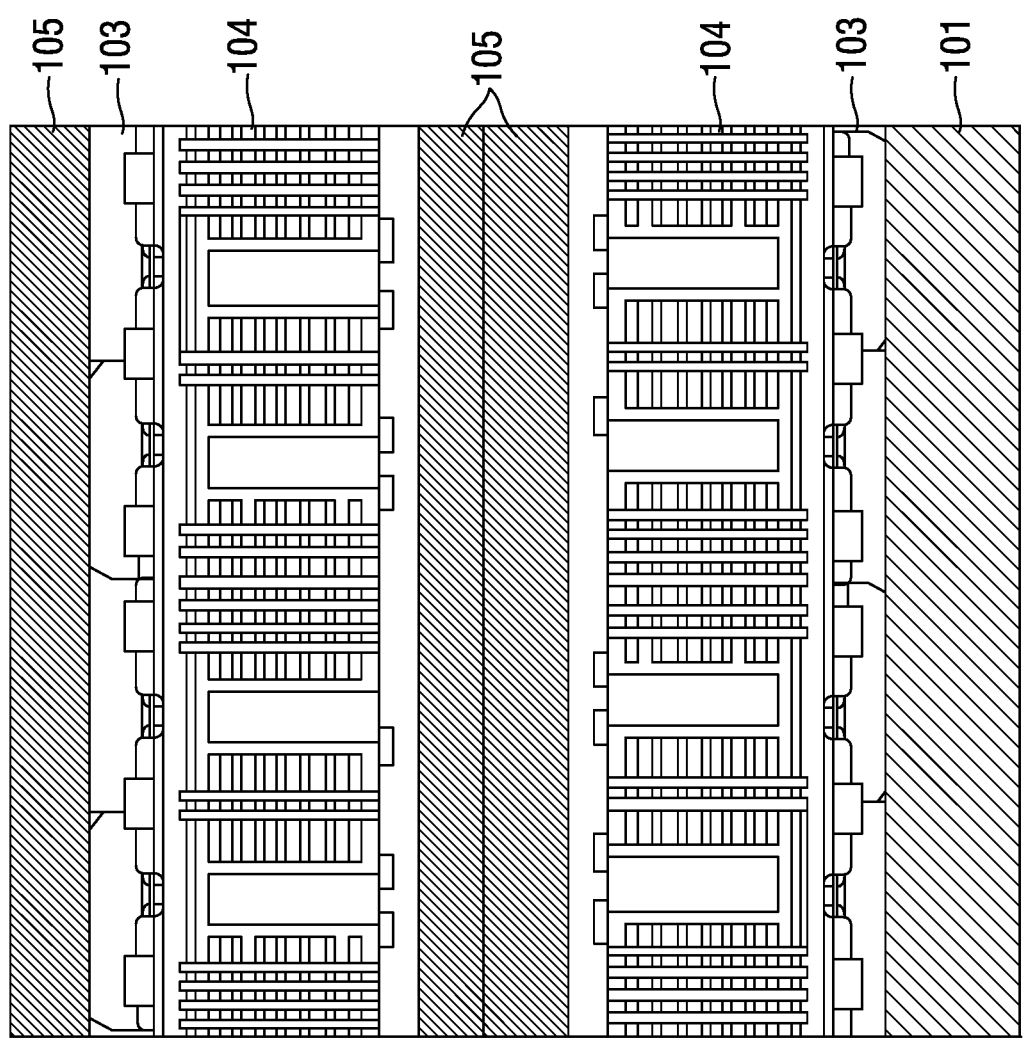
Figure 4A:
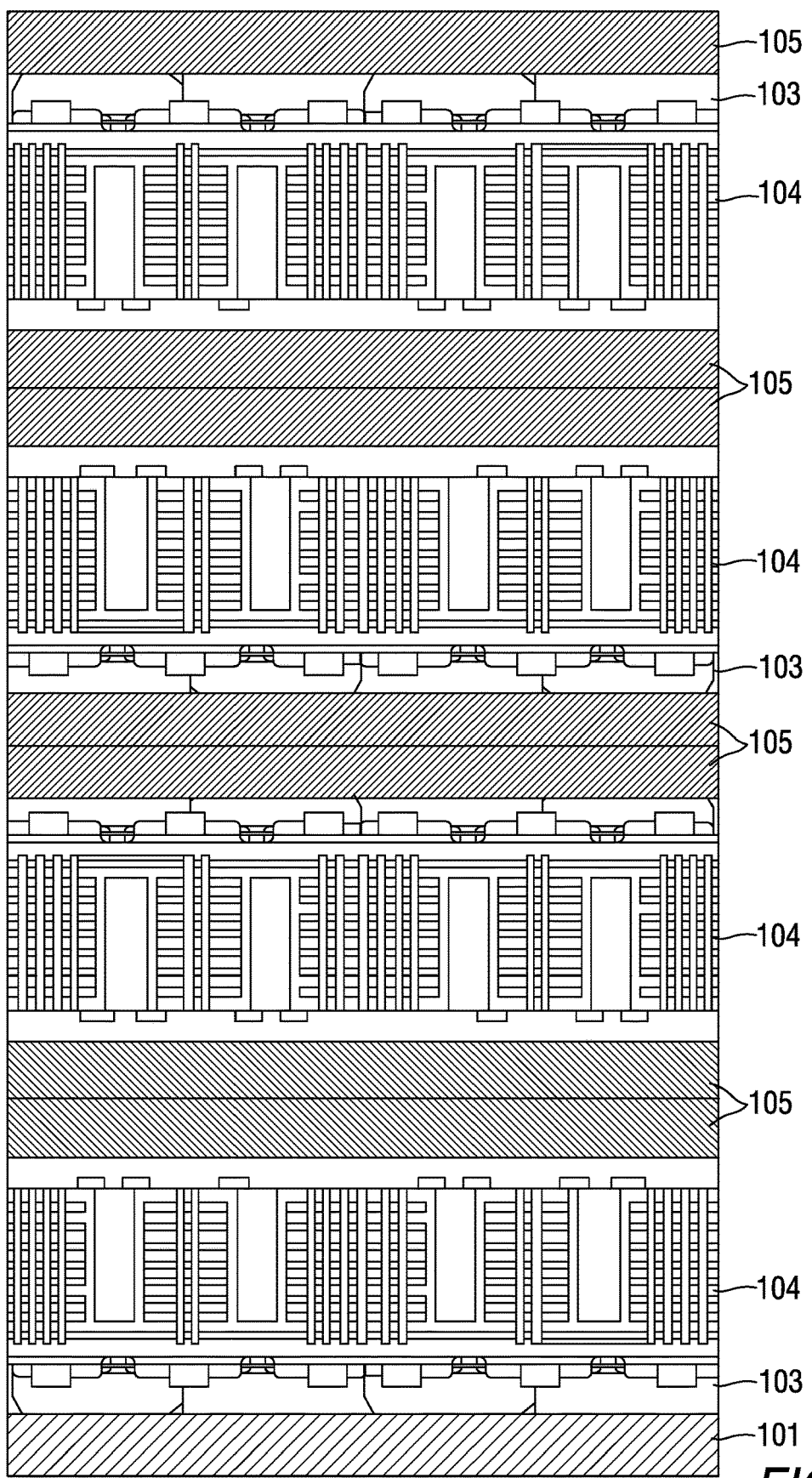
Figure 4B:
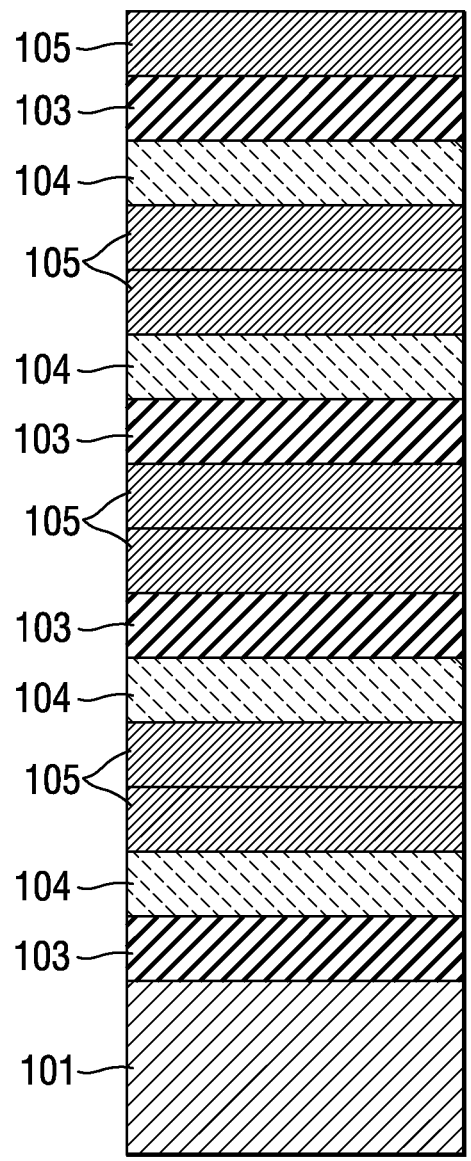

FIGS. 3A and 3B show a cross section of an example of the device of FIG. 2D. FIGS. 3A and 3B show memory devices 104 as well as planar devices 103. FIGS. 4A and 4B illustrate how stacking can used to increase memory density by four times.

Figure 7A:
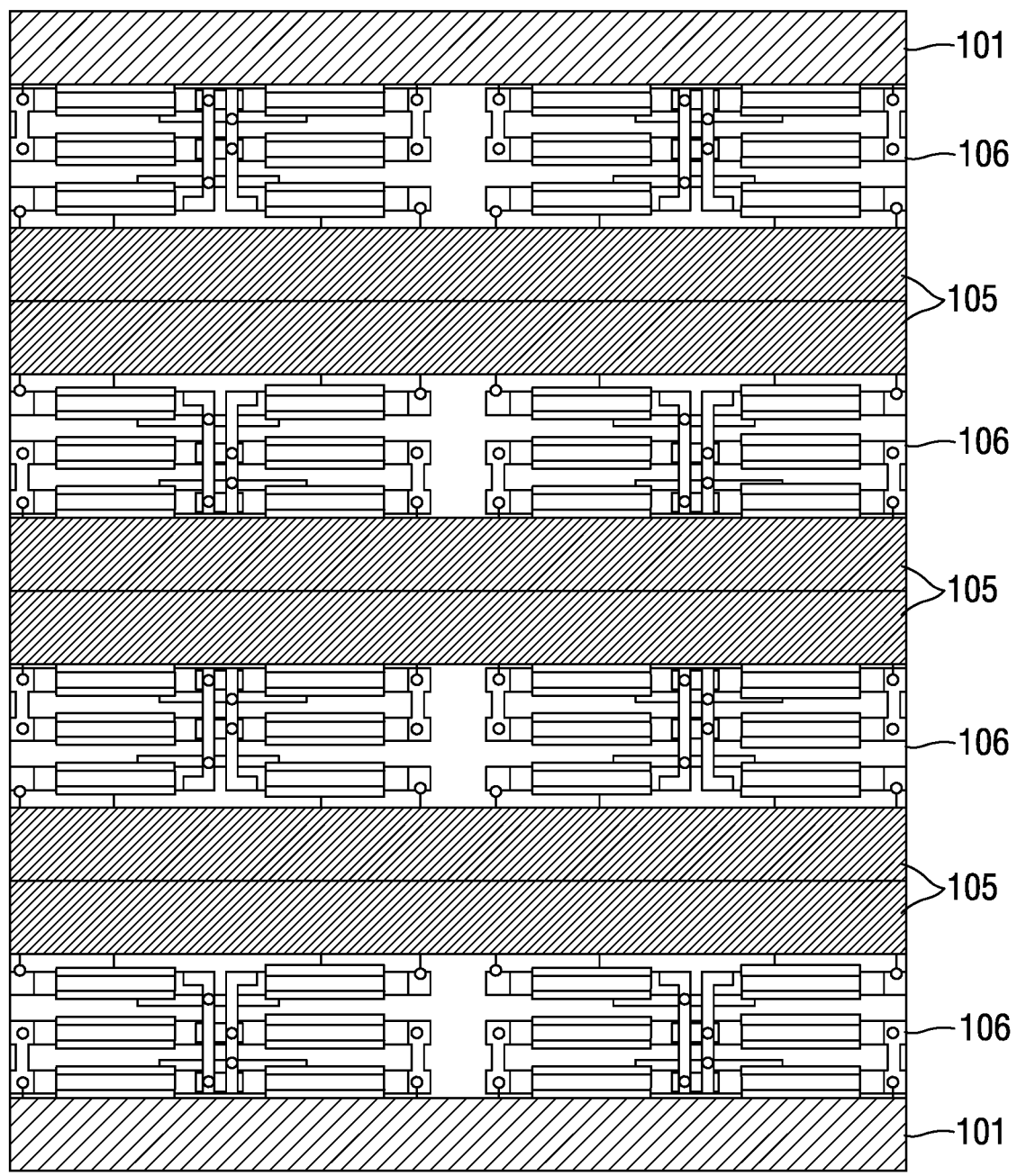
Figure 7B:
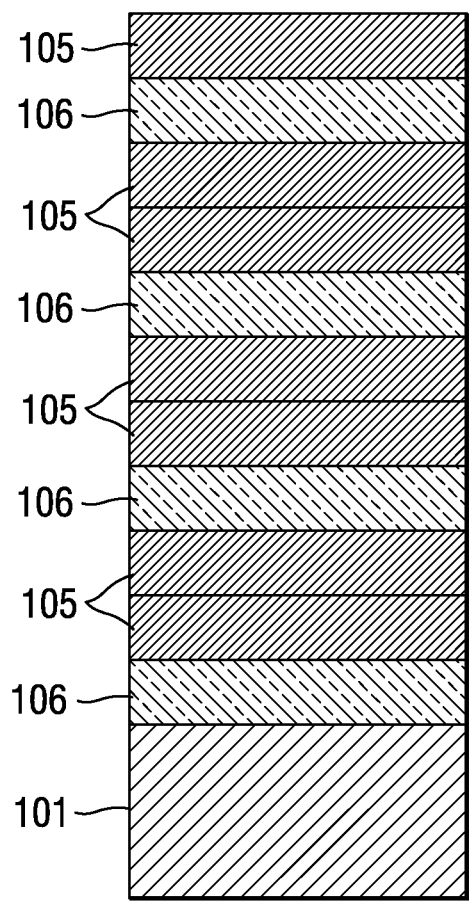

Process flows herein can operate without the dielectric (oxide) between devices on any of the substrates. FIGS. 5A to 5D show such an example with 3D SRAM 106 to double or quadruple memory density. Stacking in FIG. 5A to 5D is similar to FIGS. 2A to 2D, but with a layer of 3D SRAM and 3D Logic 106. FIGS. 6A to 6B illustrate a cross section of the device of FIG. 5D showing example 3D SRAM and Logic devices. FIGS. 7A and 7B illustrate how this stacking can be continued to quadruple device density.

FIGS. 8A to 8D illustrate an example flow with oxide between devices and substrate on alternating wafers. This example has two memory planes which doubles a density of combined 3D LOGIC and 3D SRAM. Stacking of FIGS. 8A to 8D is similar to that of FIGS. 1A to 1D.

In FIGS. 8A to 8D, two substrates are combined. In the example embodiment of FIGS. 8A to 8D, only the first substrate includes oxide between the devices' plane and the bulk substrate material. Thus, the lower substrate in FIG. 8A has devices 106 formed directly on bulk substrate material 101.

Figure 8D:
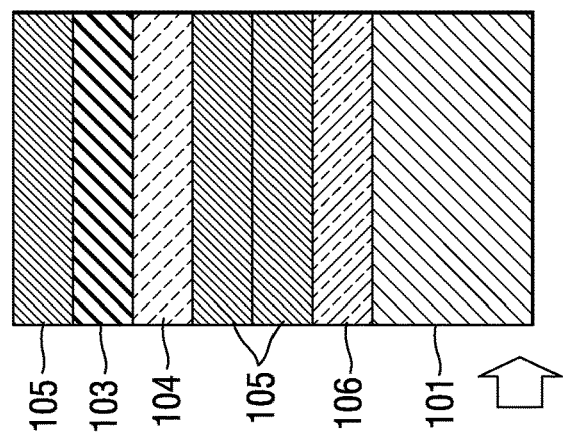
FIGS. 8A-8D show a schematic of another flow process of combining two substrates
Figure 8C:
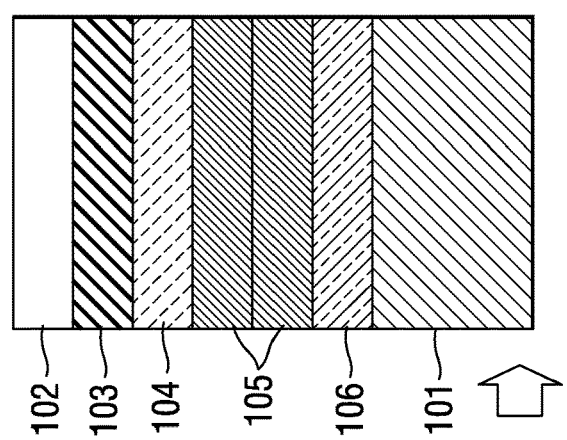
Figure 8B:
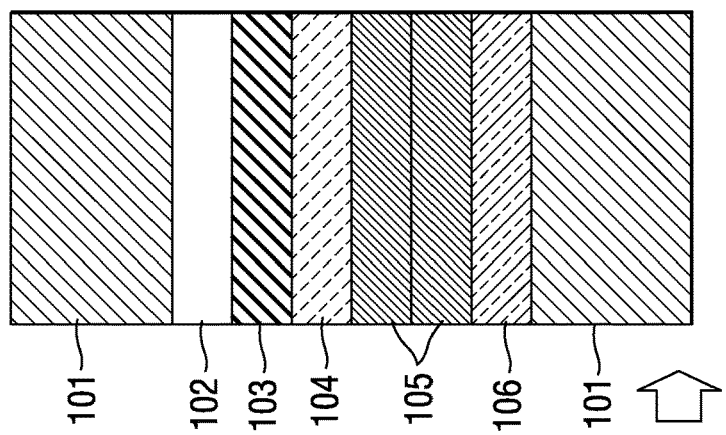
Figure 8A:
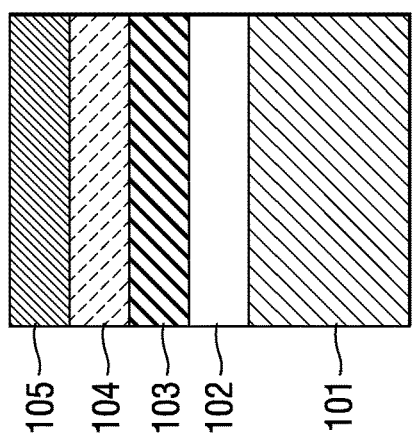

In FIG. 8A, the upper substrate 101 has a dielectric (such as silicon oxide) 102 deposited on bulk substrate material (such as silicon). On the dielectric 102, a plane of LV devices and HV devices 103 is fabricated. The plane of LV and HV devices 103 can include 3D devices, stacked devices, lateral gate-all-around devices, and so forth. On the plane of LV and HV devices 103 a plane of memory devices 104 is formed, where these memory devices 104 can include 3D NAND memory. On the plane of memory devices 104 a wiring plane 105 is formed. This wiring plane (Metal X routing) 105 can have one or multiple wiring levels. Wiring structures herein can be formed with conventional processes such as depositing oxide, using a photo mask to etch trenches and vias, adding contacts. The lower substrate of FIG. 8A has 3D LOGIC and 3D SRAM devices 106 followed by a wiring plane 105 on this second substrate 101.

Figure 10B:
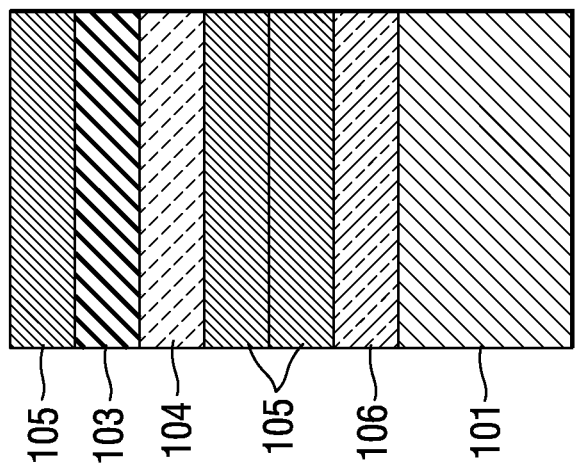
FIGS. 10A-10B show a schematic of a cross section of the device of FIG. 9D
Figure 10A:
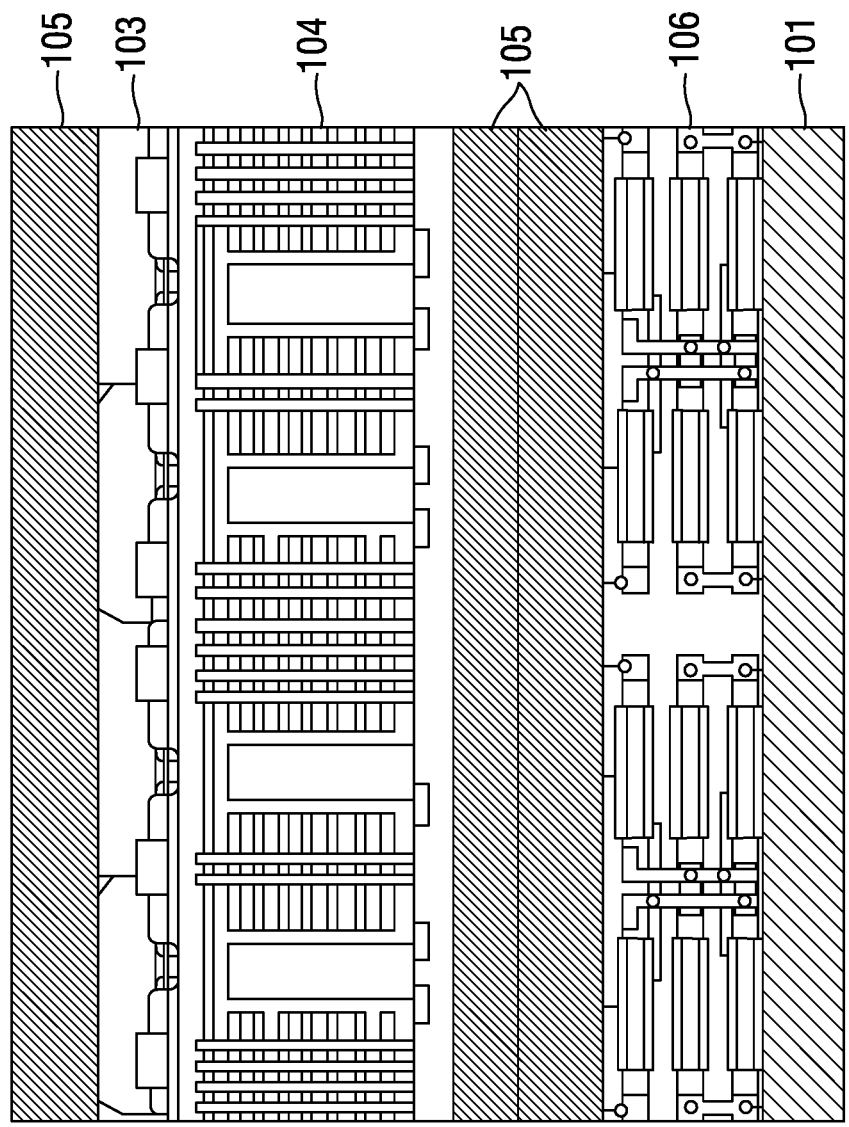
Figure 11:
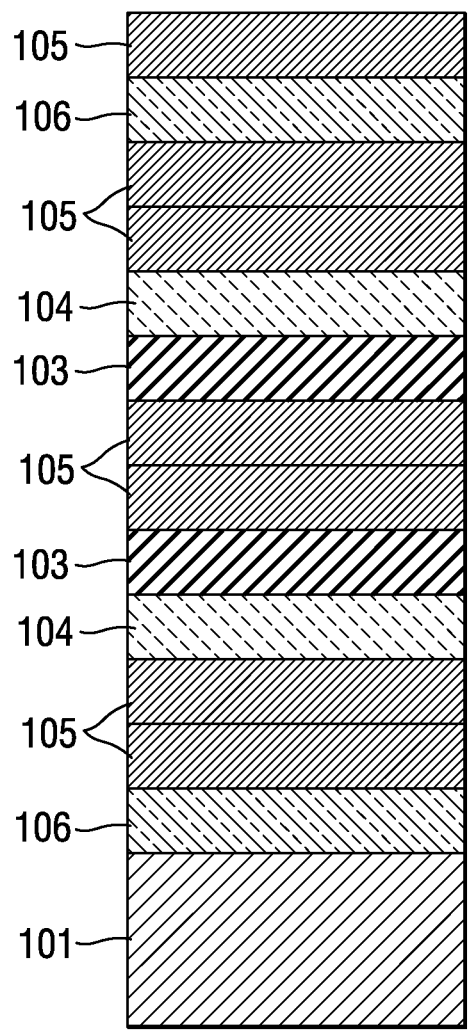
FIG. 11 shows a schematic of a stacking of substrates with increased memory density

In FIG. 8B, the two substrates are aligned and joined at their respective metal wiring layers. Accordingly, one substrate is essentially flipped to make this alignment. After the substrates are bonded at low temperature, the bulk material on one of the substrates can be grinded or polished until reaching the dielectric 102 (FIG. 8C). Then this uncovered layer of oxide can be converted into a metal routing layer (wiring plane) (FIG. 8D). Accordingly, a combined substrate is generated, and additional wiring and fabrication steps can be executed. This flow can double a density of existing 3D NAND technology, with a memory increase of 2 to 5 times. FIGS. 9A to 9D are similar to FIGS. 8A to 8D, but without a layer of oxide. FIGS. 10A to 10B show an example, enlarged cross section of FIG. 9D. FIG. 11 illustrates quadrupling memory density of FIG. 9D.

Figure 13A:
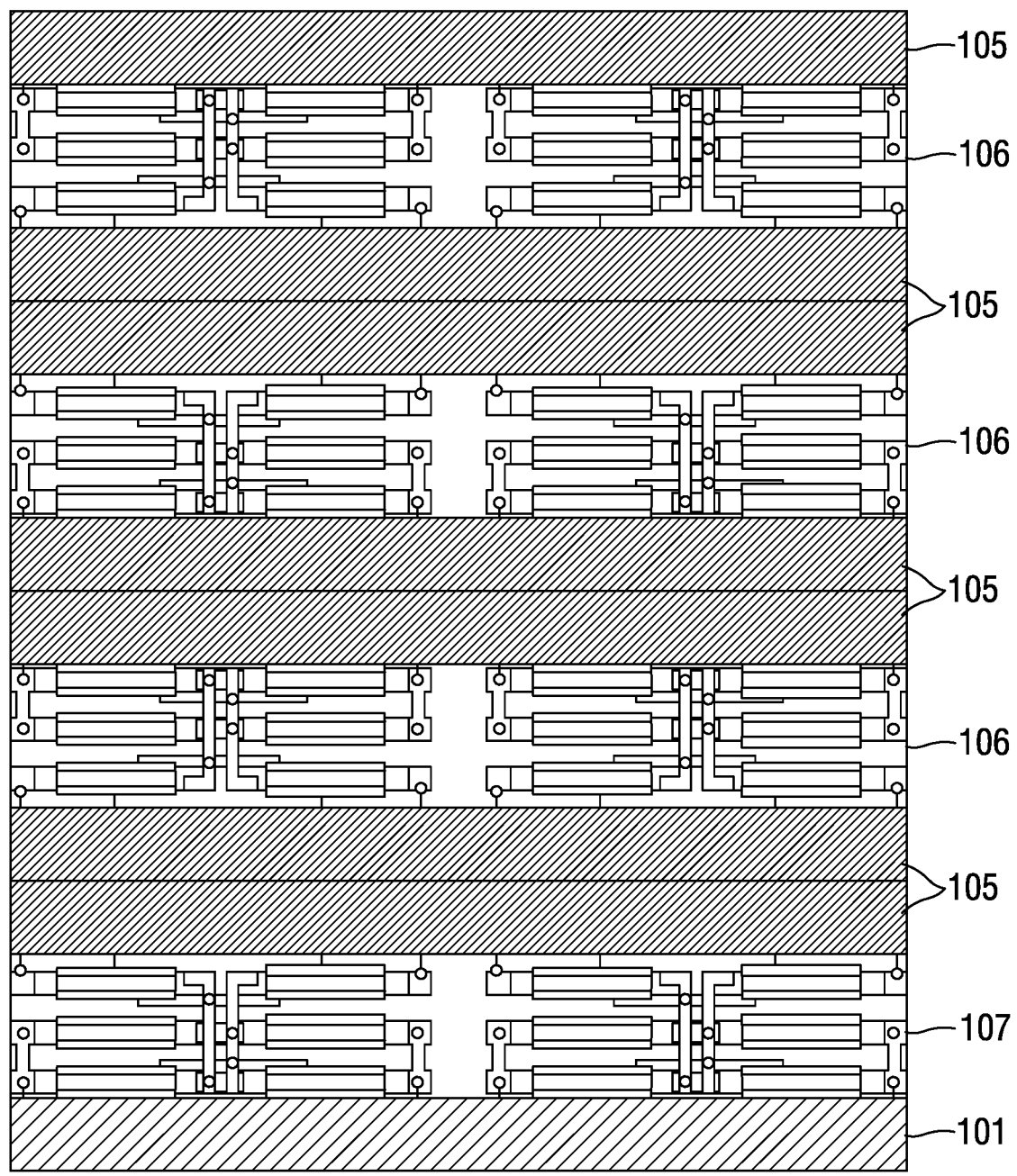
FIGS. 13A-13B show a schematic of a stacking of substrates with increased memory density
Figure 13B:
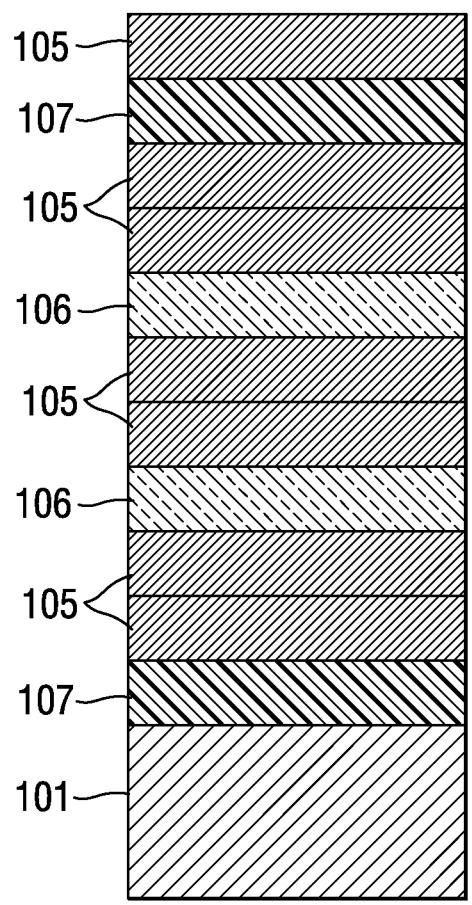

Other embodiments can include a combination of one or more microprocessor cores (CPU+Logic+3D SRAM) and 3D SRAM on different wafers combined into one wafer stack for high speed computing. FIG. 12A shows a first wafer with 3D SRAM and 3D Logic 106 to be stacked on a second wafer with a microprocessor and 3D SRAM 107. FIGS. 12B-12D illustrate stacking and bonding. FIGS. 13A and 13B show quadruple of density of this combination.

In FIGS. 14A-14D, three substrates are used. A first substrate for 3D SRAM and 3D Logic 106, a second for a microprocessor layer and 3D SRAM 107, and a third substrate that has a layer of HV and LV devices 103, as well as a layer of 3D NAND memory 104.

In FIG. 14A, on a first substrate, a layer of 3D SRAM and 3D Logic devices 106 is formed, followed by the formation of a first wiring plane 105 above the layer of 3D SRAM and 3D Logic devices. On a second substrate, a layer of microprocessor and 3D SRAM devices 107 is formed, followed by the formation of a second wiring plane 105 above the layer of microprocessor and 3D SRAM devices. The first wiring plane is then aligned to be in contact with the second wiring plane by joining the first substrate with the second substrate to form a combined substrate.

In FIG. 14B, on a third substrate, a layer of low-voltage and high-voltage devices 103 is formed, followed by the formation of memory devices 104 on the layer of low-voltage and high-voltage devices 103, and then a wiring plane 105 is formed above the memory devices 104. The wiring plane of the third substrate is then aligned to be in contact with the wiring plane of the combined substrate. After the substrates are bonded, the bulk material of the third substrate is grinded or polished (FIG. 14C). Then the remaining substrate material is converted to an oxide layer to form a wiring plane 105 on this dielectric (FIG. 14D).

Figure 15A:
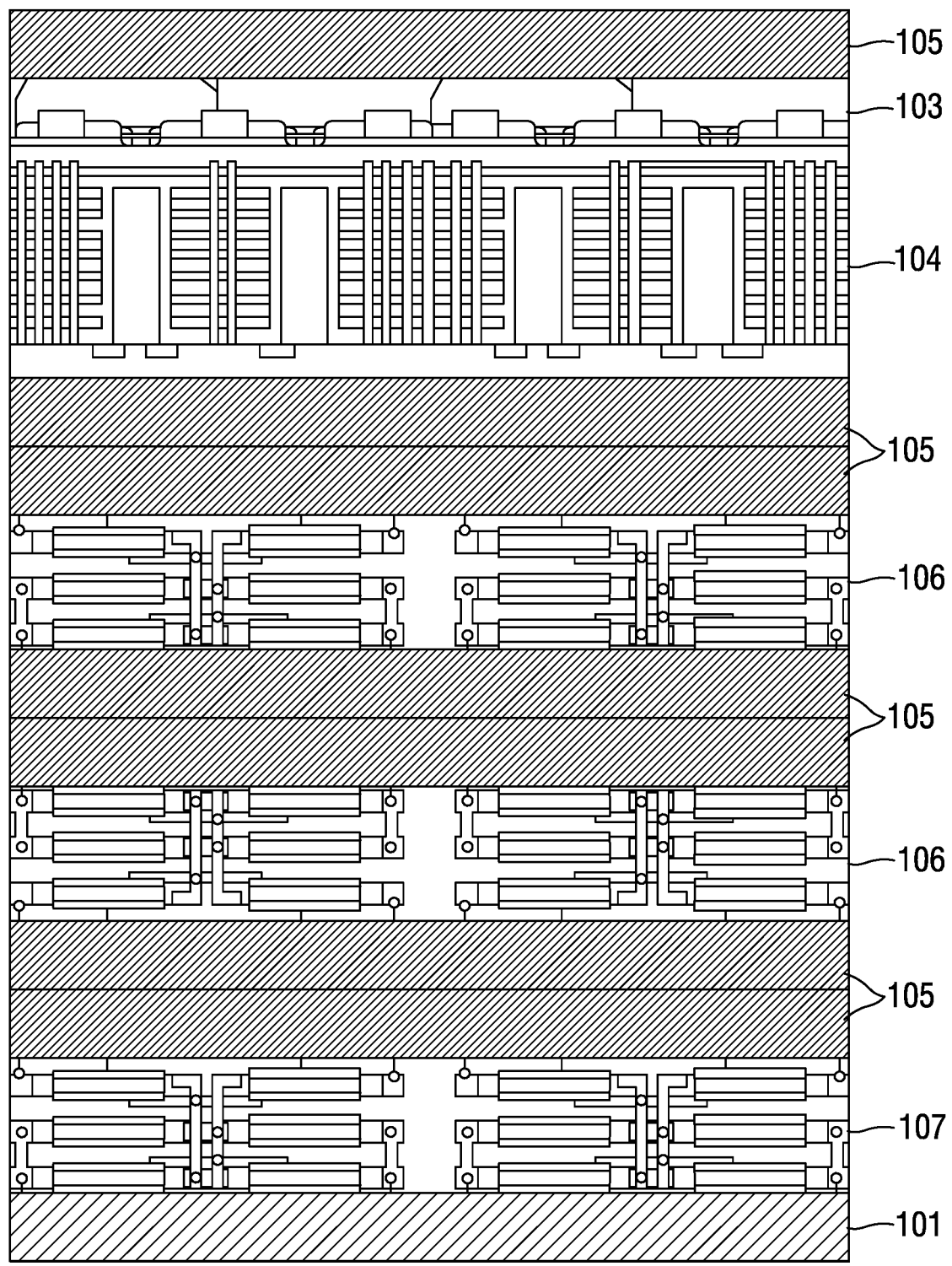
FIGS. 15A-15B show a schematic of a cross section of the device of FIG. 14D
Figure 15B:
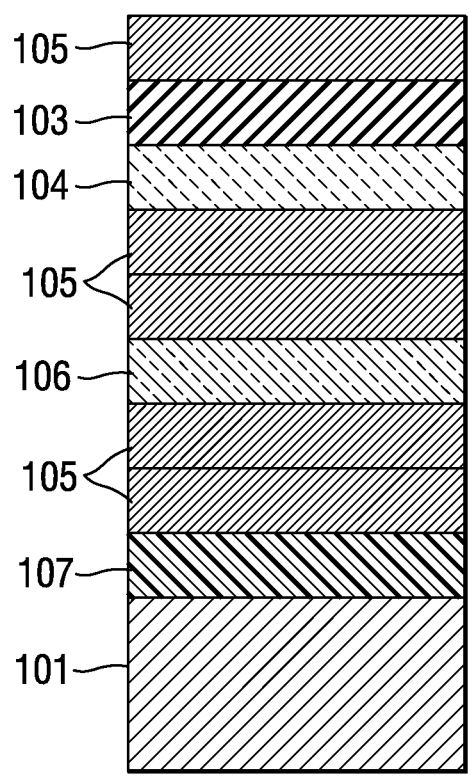

FIGS. 15A and 15B show an example cross section of FIG. 14D.

Figure 16:
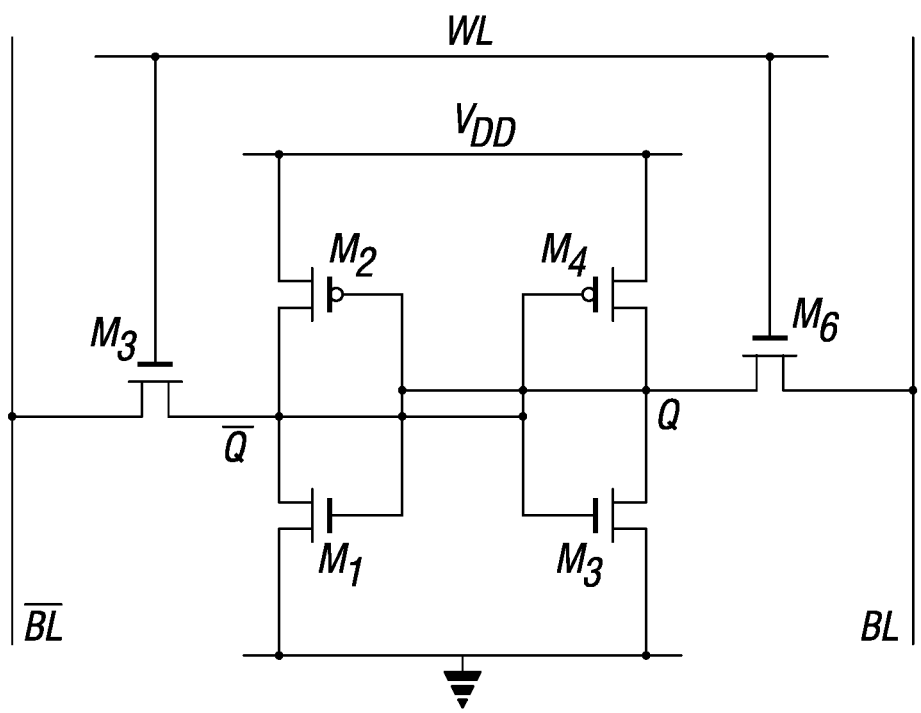
FIG. 16 shows a schematic of a six-transistor CMOS SRAM cell

FIG. 16 illustrates a schematic of a six-transistor CMOS SRAM cell used with embodiments herein.

FIGS. 17-34 show a process flow for a grown silicon connection with SRAM access transistors on top.

Figure 17:
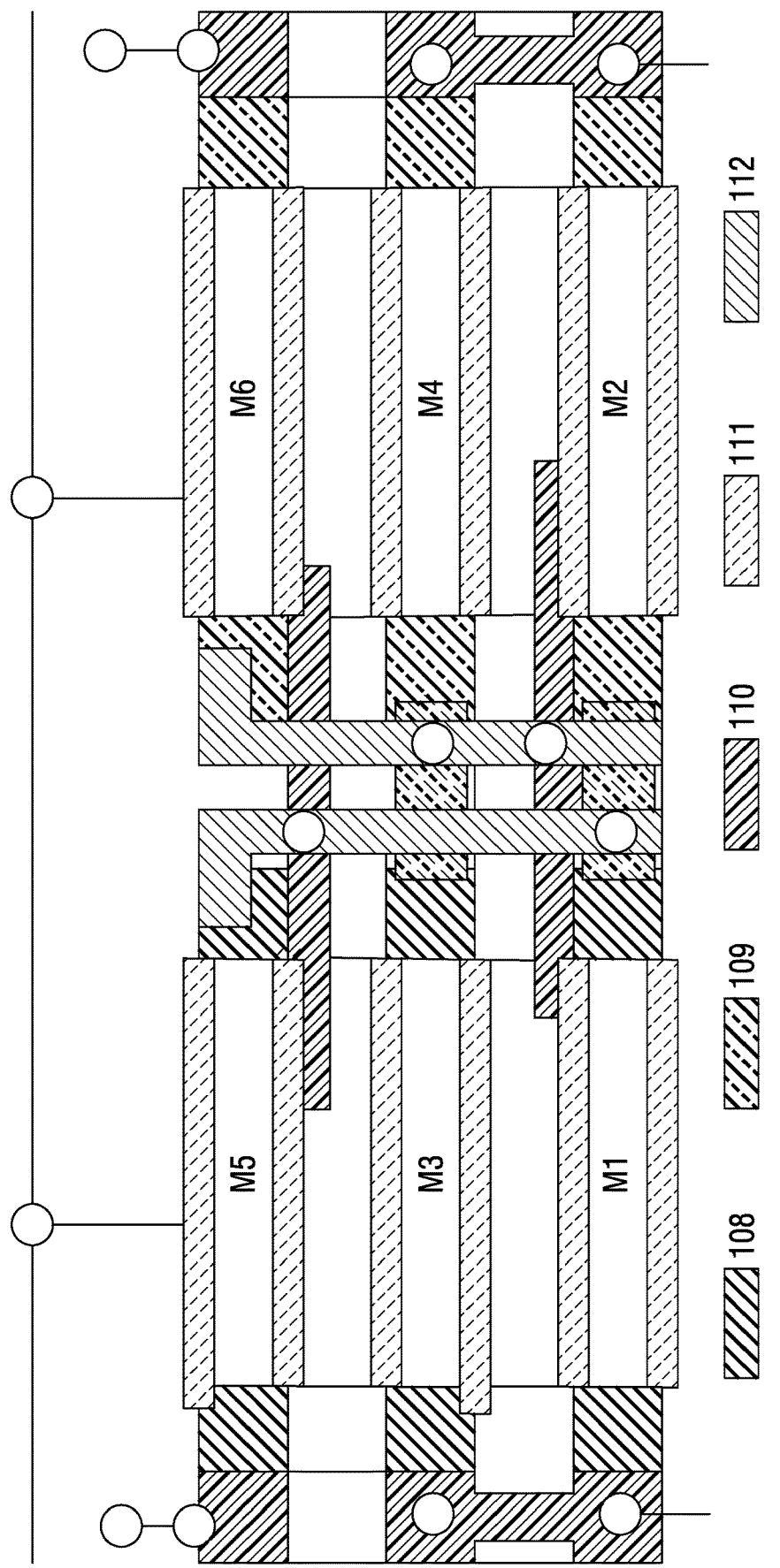

FIG. 17 is a cross section of an example substrate segment showing a side-by-side 6T SRAM cell with access transistors on a top of the cell and bit line hookup (BL & BL) and word line hookup from top and buried power rail hookup for $V_{dd}$ and GND on bottom of the cell. A buried power rail is a power rail positioned below active devices. The buried power rail can be formed in a bulk silicon area. In FIG. 17, 108 is the N+S/D region, 109 is the P+S/D region, 110 is the insulator, 111 is the metal gate, 112 is the pass gate transistor, 113 is the LI metal, and 114 is the channel.

Figure 19:
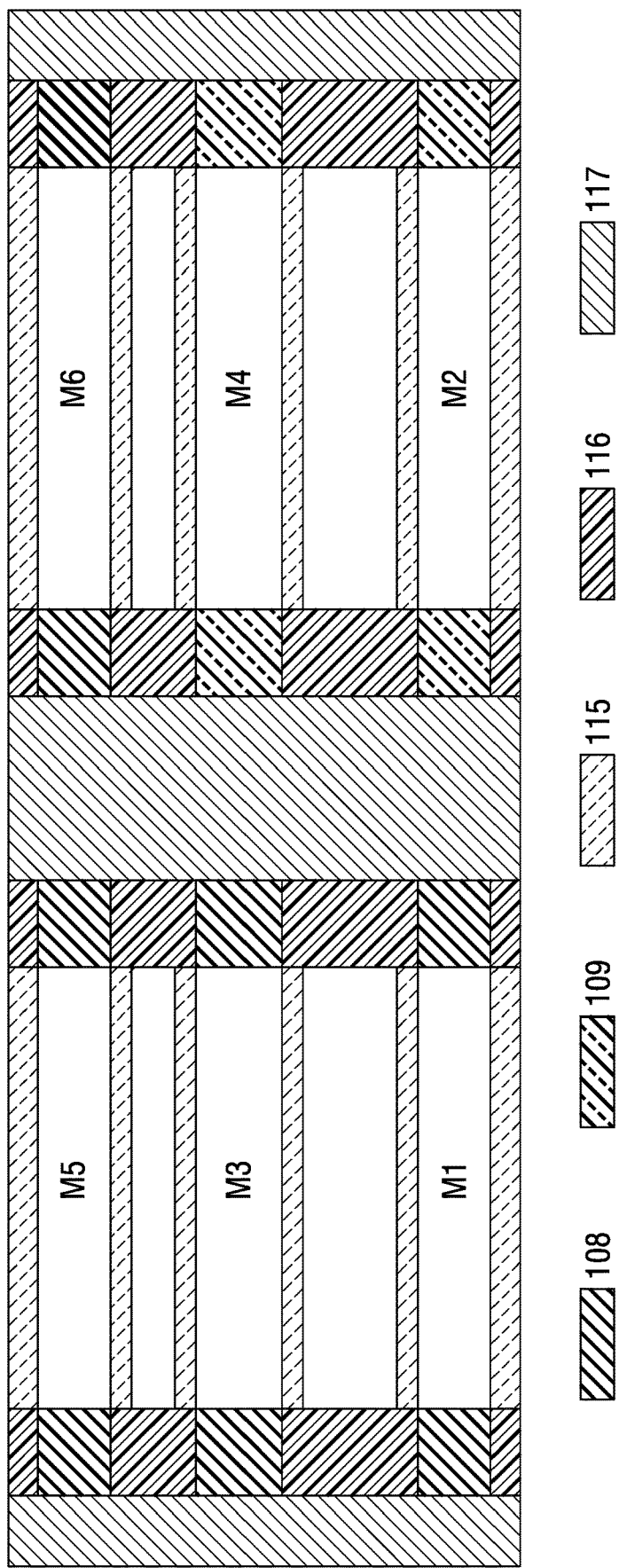
Figure 21:
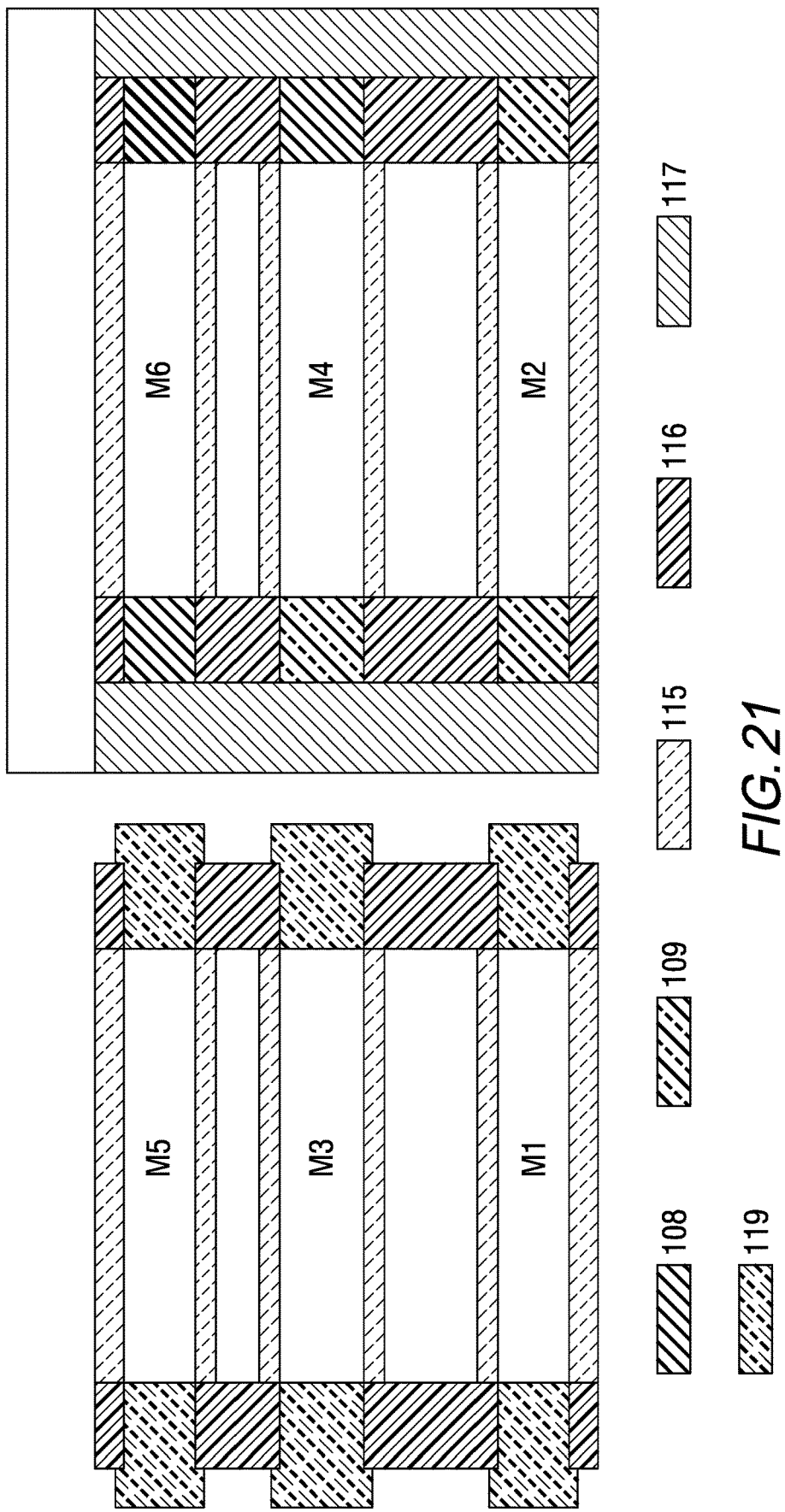
Figure 22:
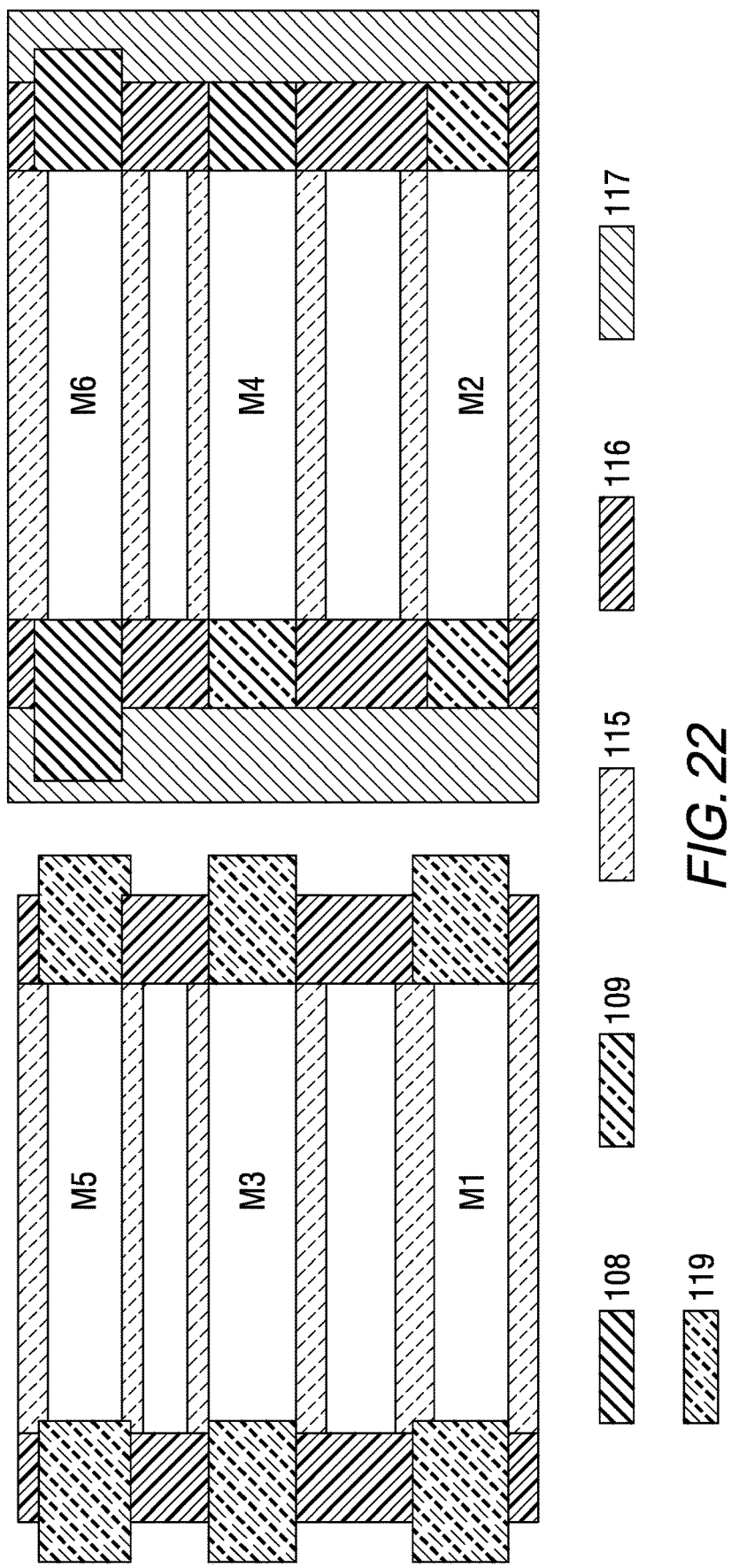
Figure 23:
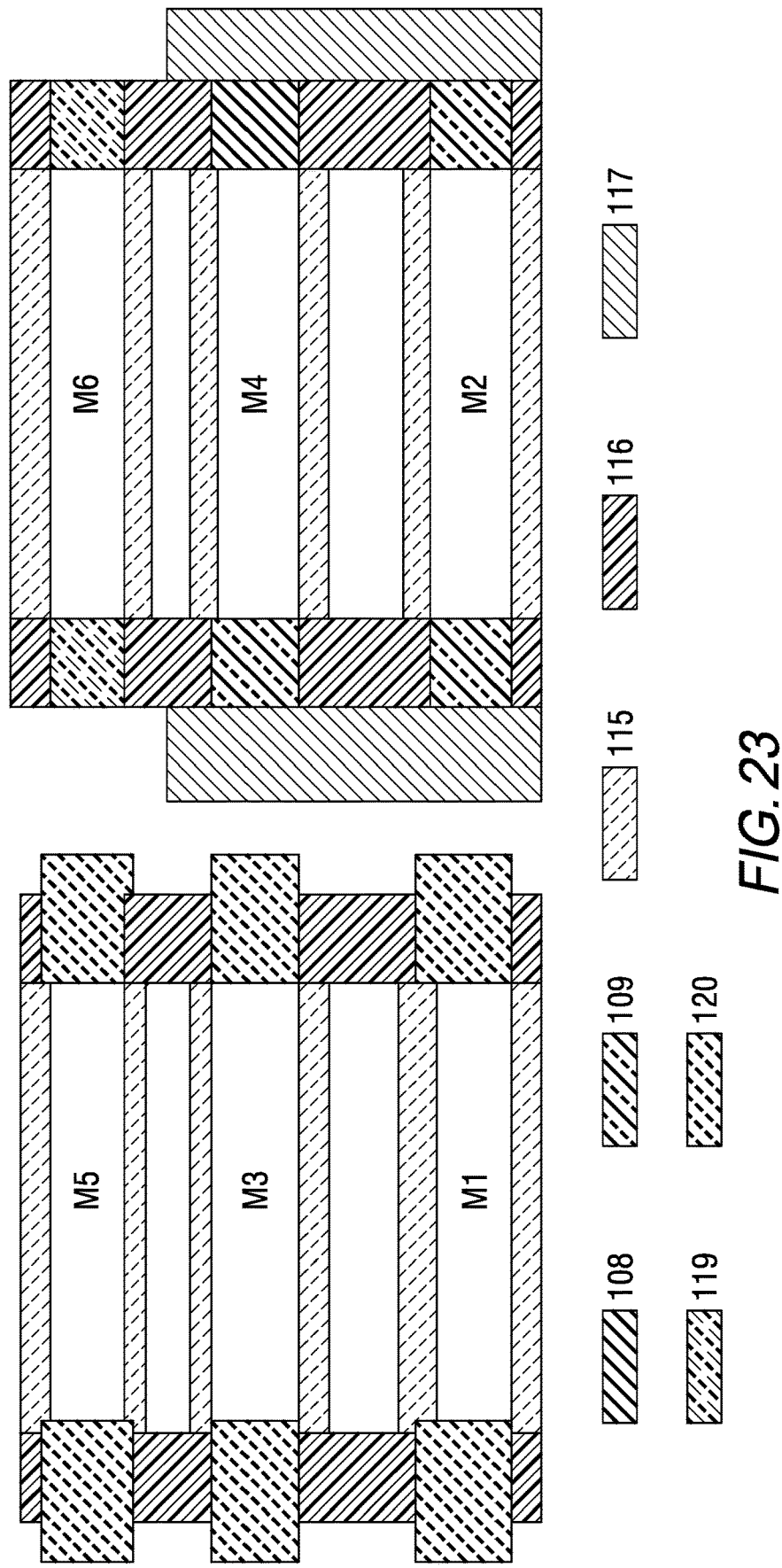
Figure 24:
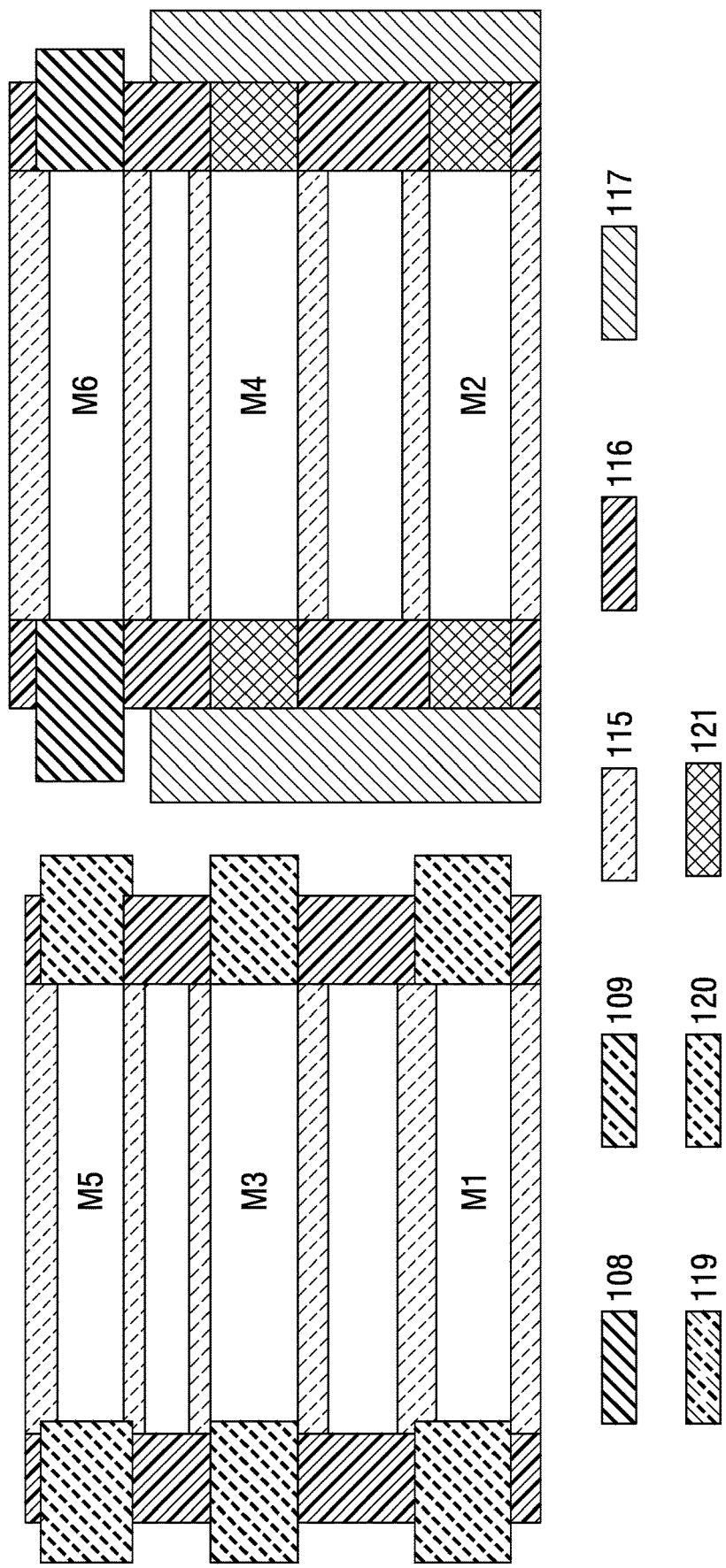
Figure 25:
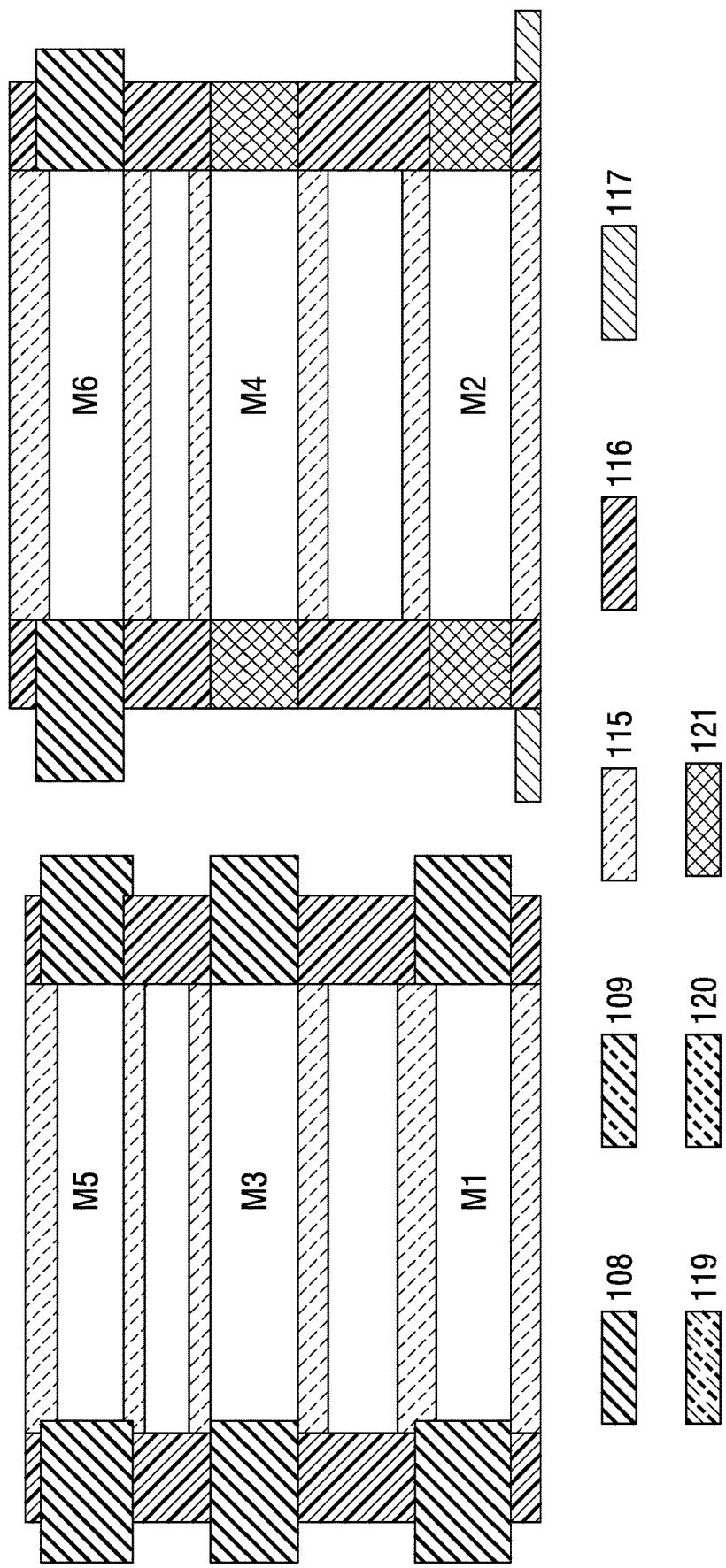
Figure 26:
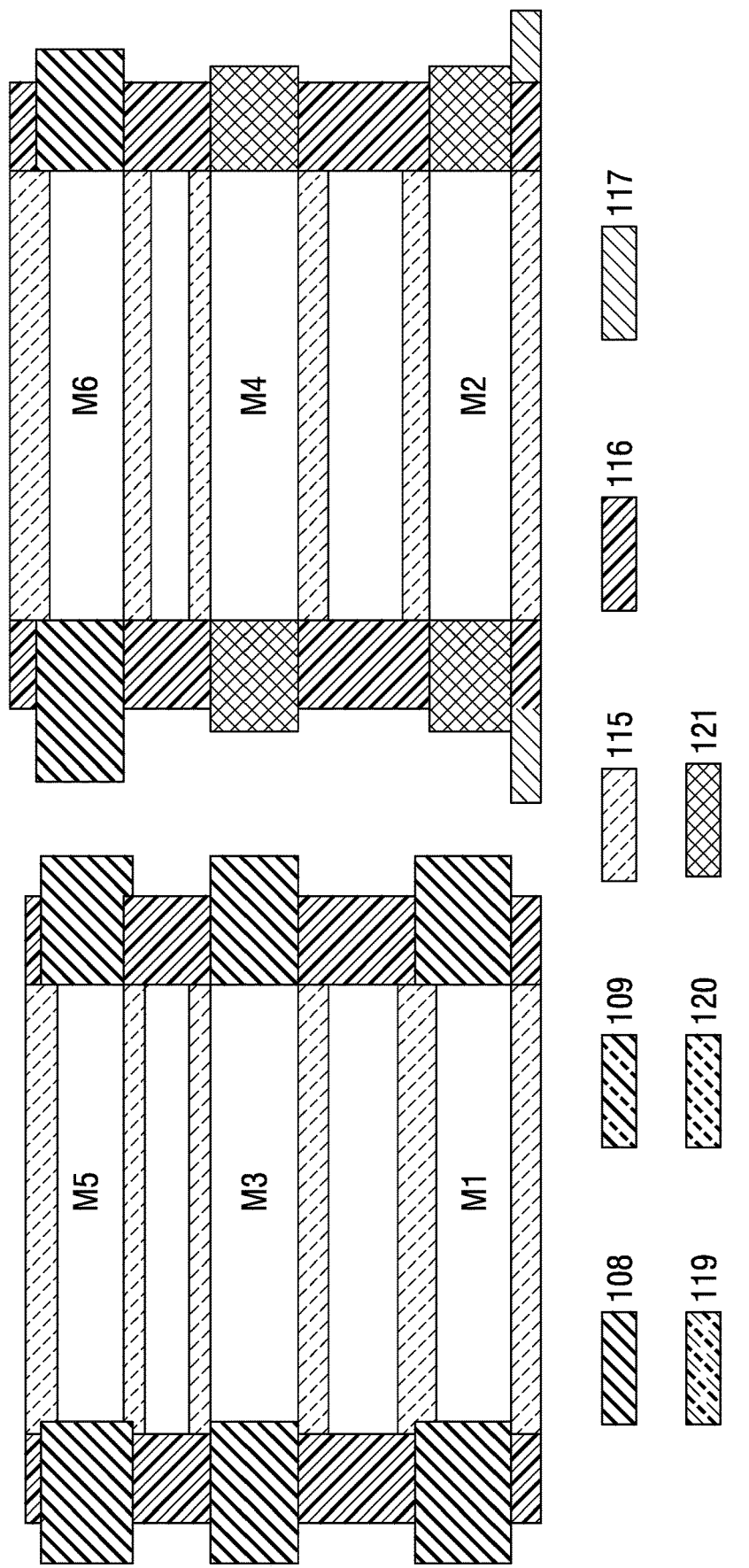
Figure 27:
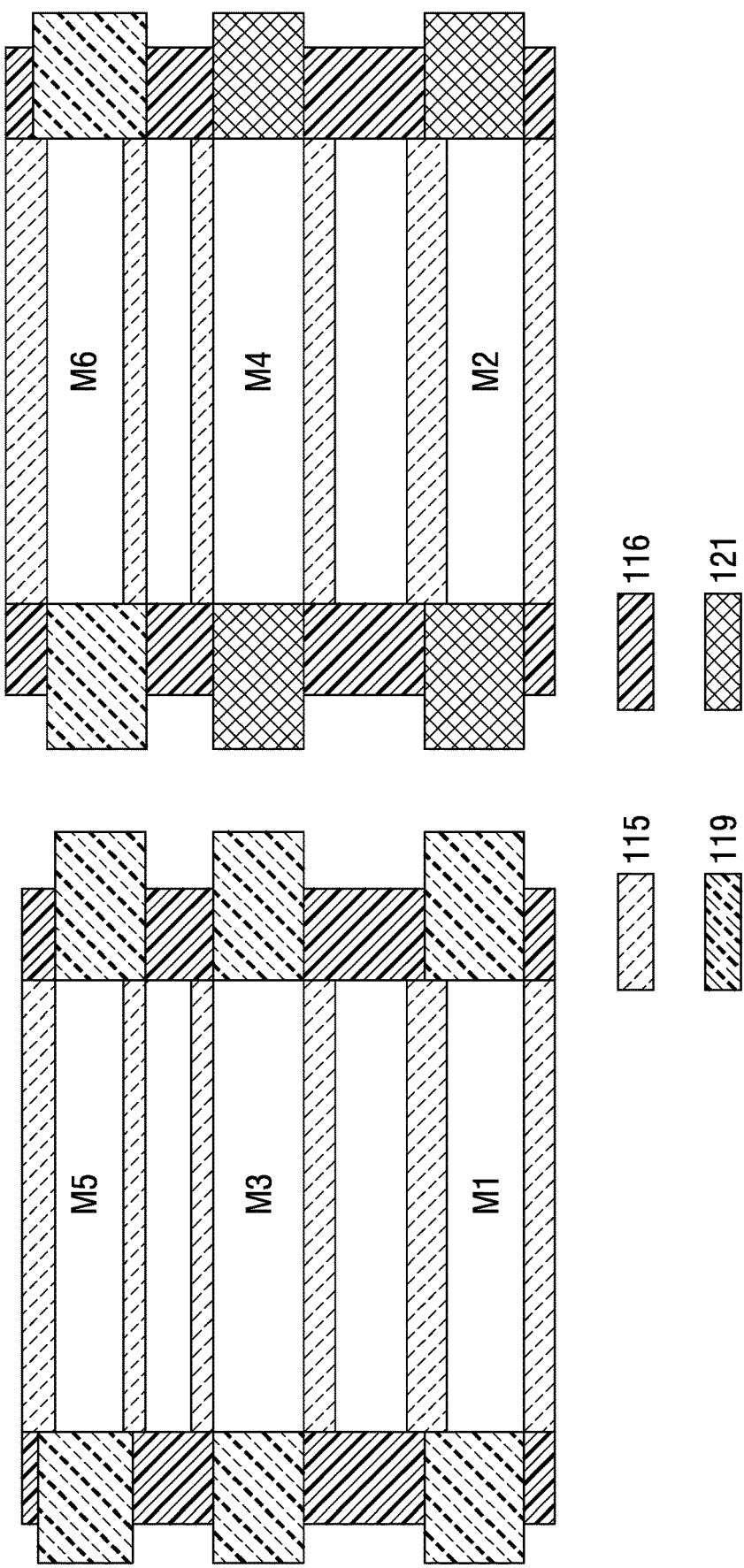

FIG. 18 shows a cross-section after processing up through source/drain formation. Note that the initial stack can be formed using alternating layers of epitaxially grown semiconductor material, which can be selectively removed and replaced. A gate protect region 115 is shown protecting channels (M1-M6). Future S/D regions 108, 109 are shown but not yet formed. Channels M1, M3, M5, and M6 have future N+ regions 108, while channels M4 and M2 have future P+ regions 109. $V_{dd}$ and ground hookup can be formed using a buried power line (not shown). 116 is an inner spacer. In FIG. 19, oxide (silicon oxide or other dielectric) 117 is deposited, and polished down to a top of the transistor stacks. An etch mask (photoresist) is formed over the right stack (FIG. 20), and then uncovered oxide is etched (removed) directionally. Then, in FIG. 21 the etch mask is removed followed by N+ epitaxial growth 119 on the left stack (not covered by oxide). A selective high-k deposition 120 is executed to cover/protect N+ epi regions 119. Other protective films can be deposited instead such as low temperature oxide growth (FIG. 22). Next, a reactive-ion etch (ME) is executed that directionally etches oxide until uncovering channel M6. Channels M4 and M2 remain covered by oxide. M6 transistor regions then have N+ epi growth 119 (FIG. 23). Newly formed N+ epi regions 119 are then selectively covered with high-k material 120 or other film (FIG. 24). Remaining oxide on the right stack is then removed by reactive etching to uncover M2 and M4 channels (FIG. 25) followed by P+ epitaxial growth 121 for M2 and M4 transistors (FIG. 26). In FIG. 27, high-K coverings 120 are removed. At this point, all the S/D regions are formed for 3D SRAM and dielectrics are removed.

Figure 28:
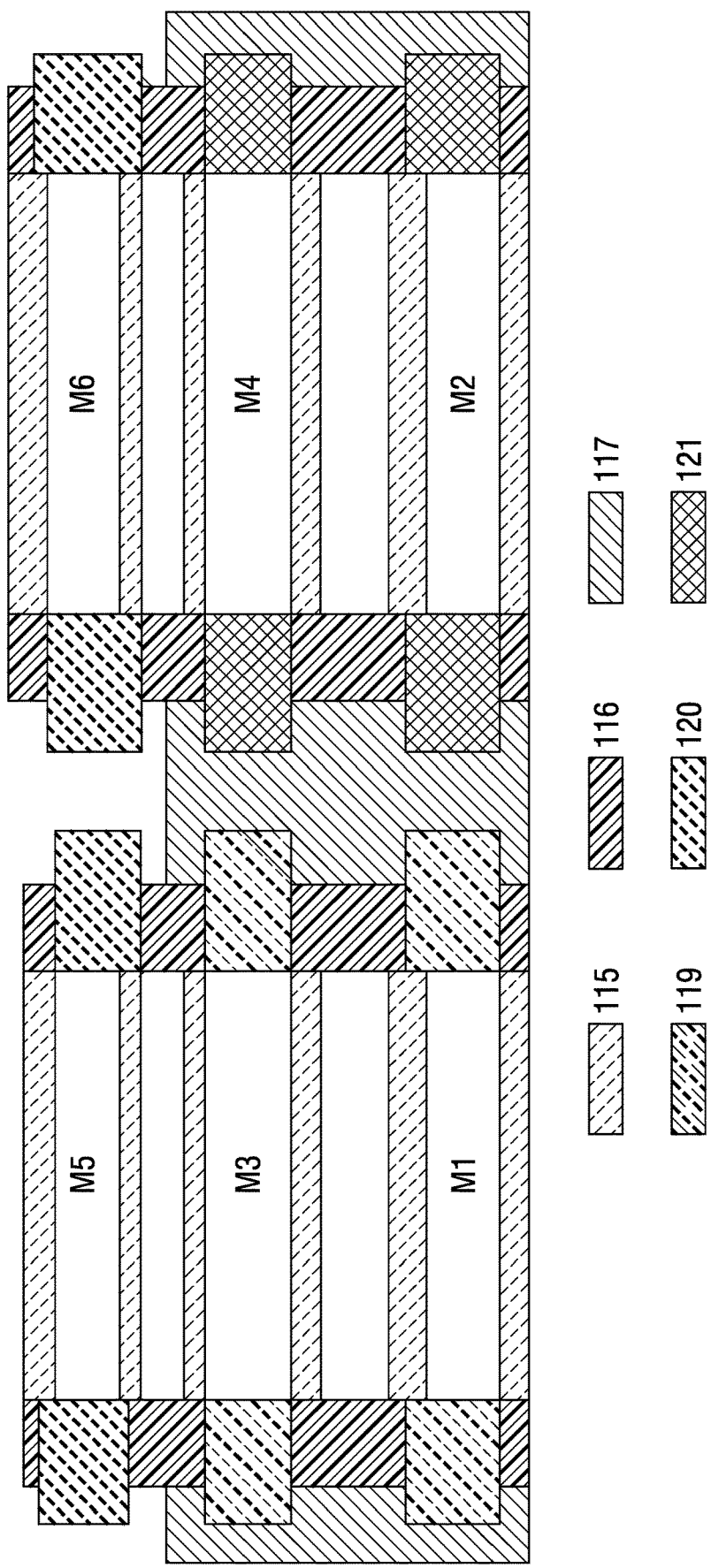
Figure 29:
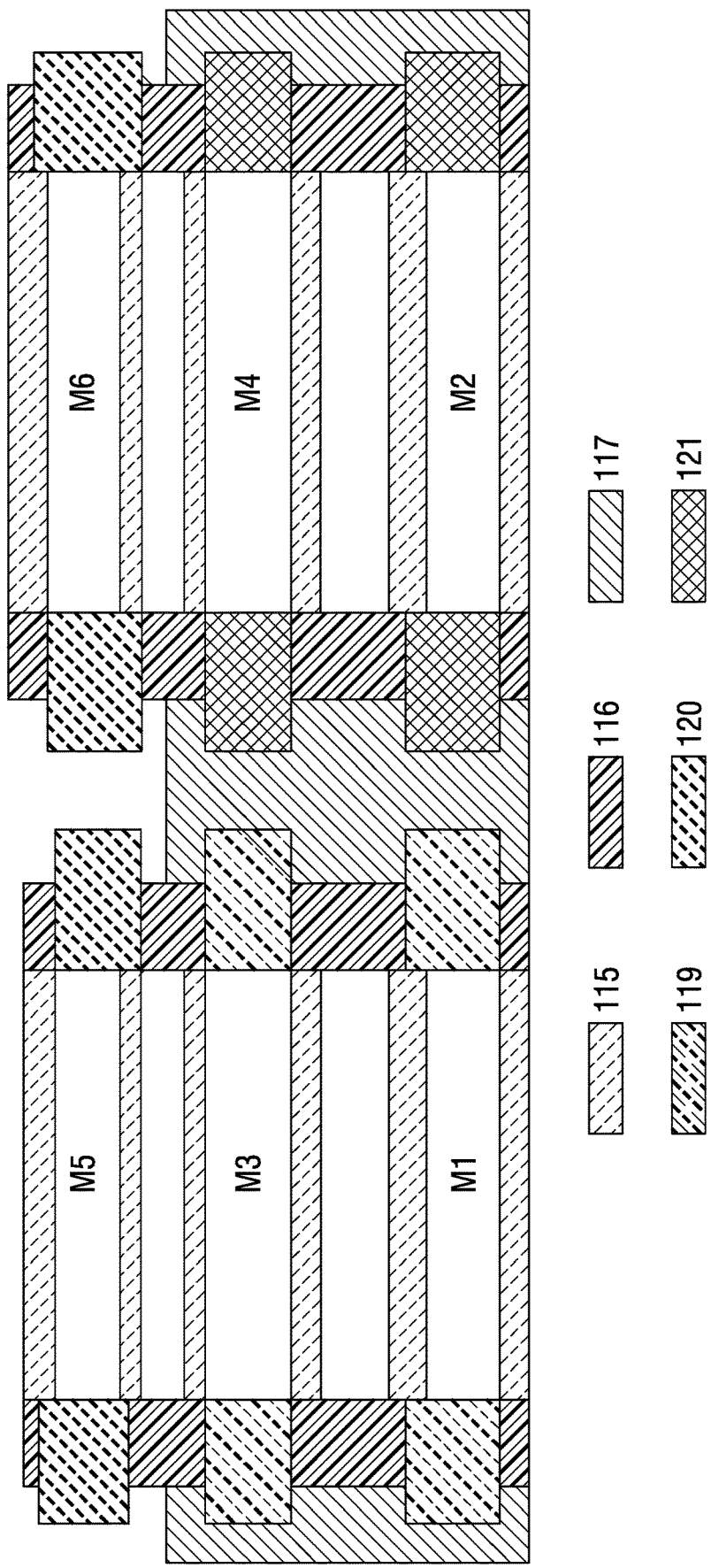
Figure 30:
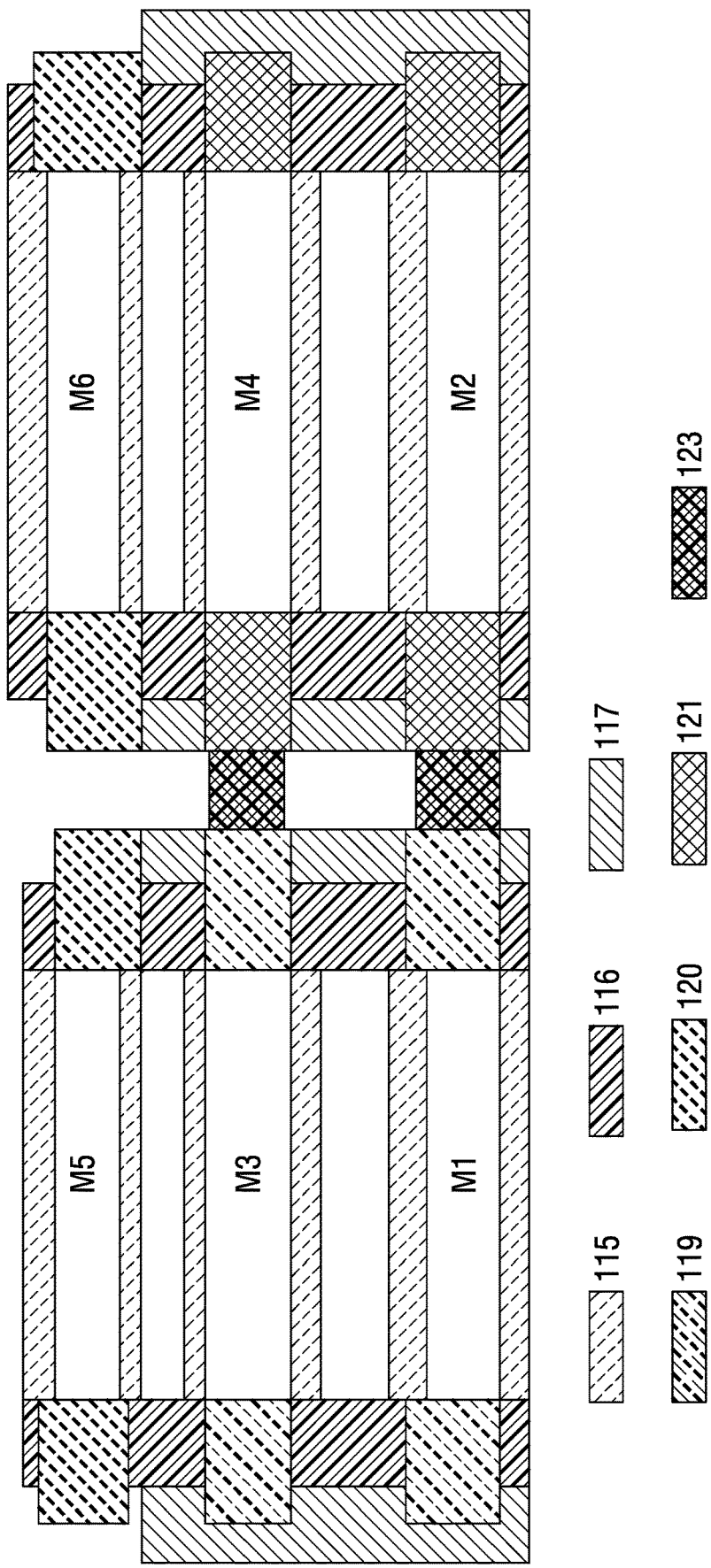

An oxide or insulator is deposited on the substrate and polished to cover all S/D regions for 6T 3D cell (FIG. 28). An etch step is executed to uncover M5 and M6 S/D edges, followed by high K selective deposition (FIG. 29). Another etch step is then executed to uncover S/D edges for M3/M4 as well as M1/M2 edges (FIG. 30).

Figure 31:
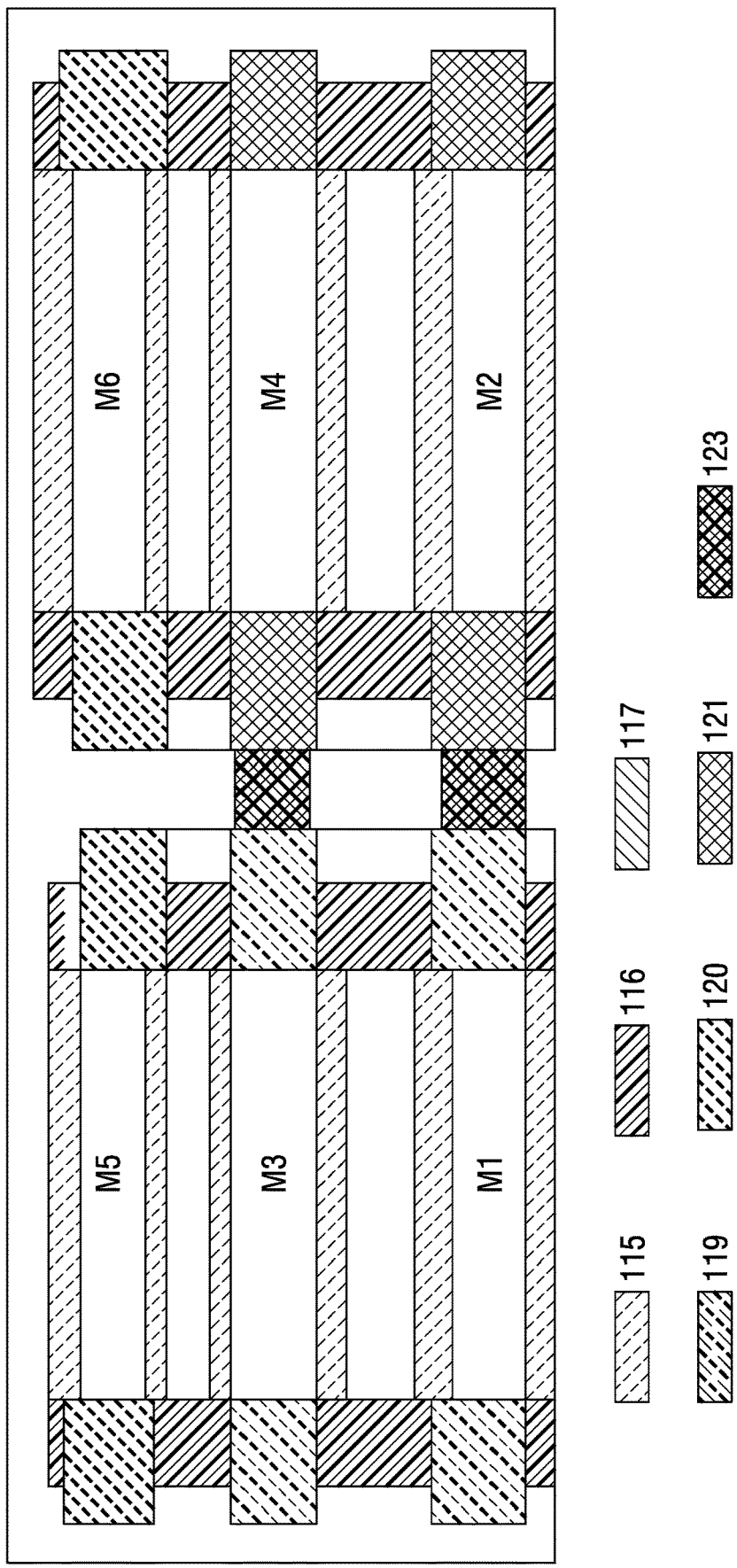

In FIG. 31, epitaxial material 123 is grown that connects the M3 and M4 regions together, and that also connects the M1 and M2 regions together. Note that the M5/M6 region will not grow together because they are covered by high-k material or other protectant. These transistors are kept separate to become pass transistors.

Figure 32:
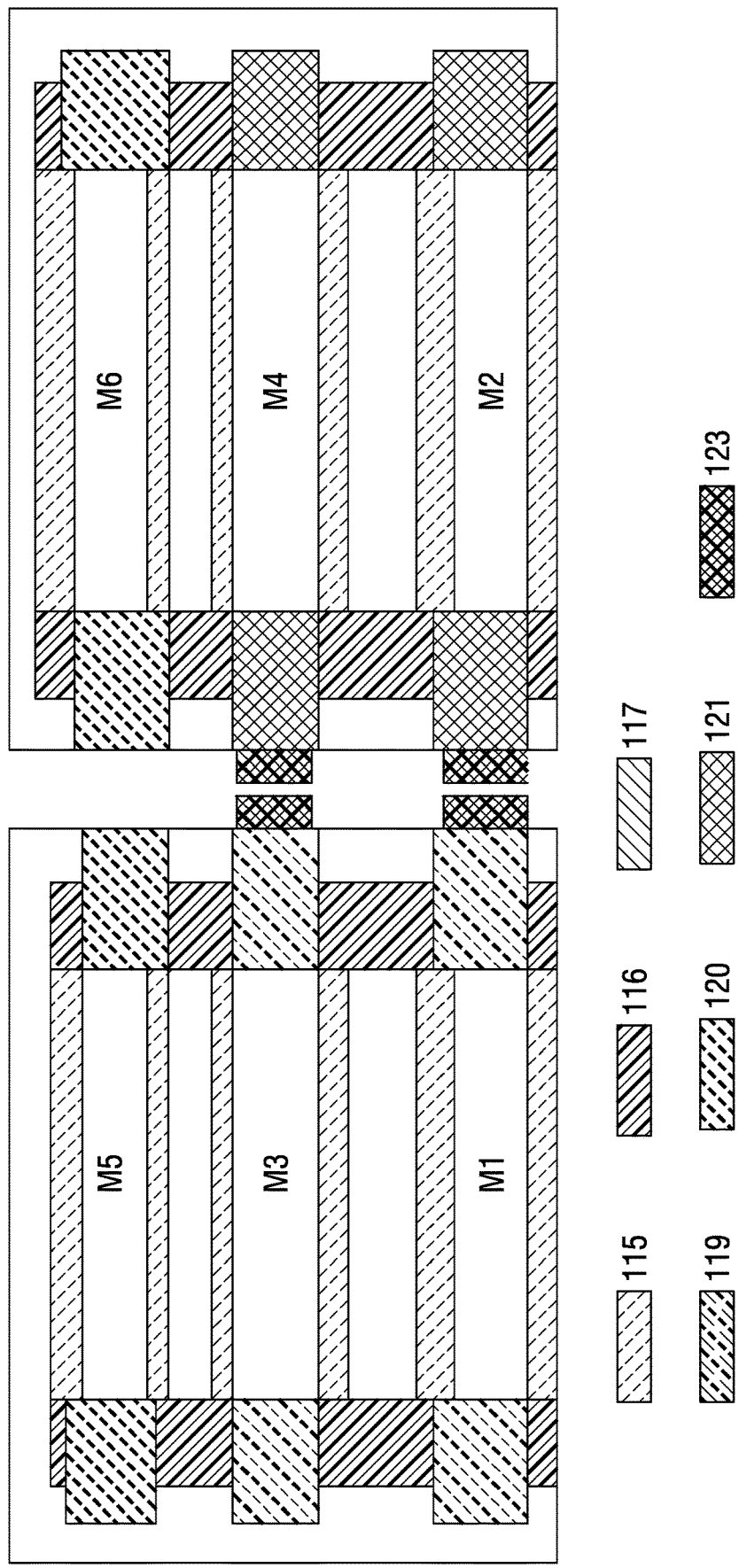
Figure 33:
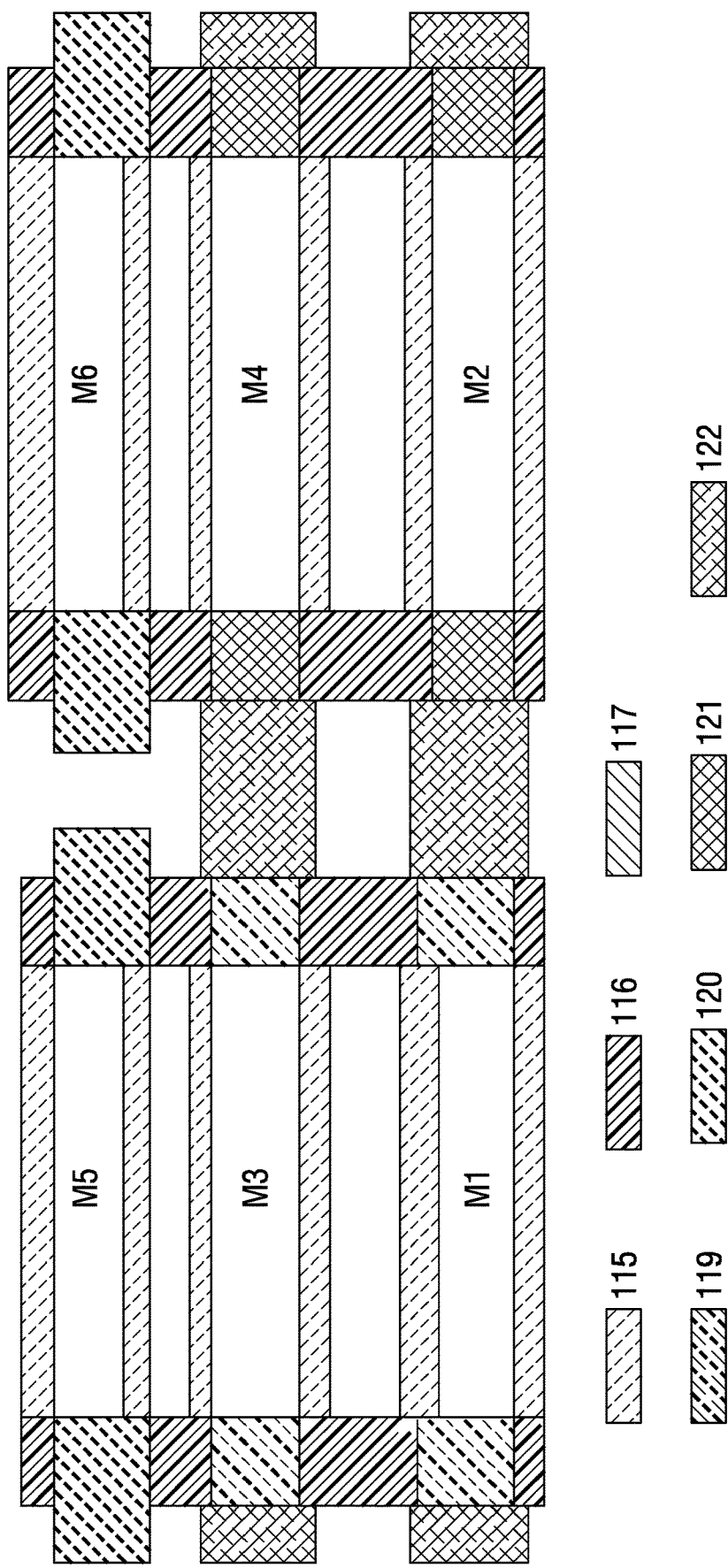

FIG. 32 shows an optional step in which a small gap is left between M3 and M4 as well as M1 and M2 regions. In FIG. 33, a wet oxide etch is used to uncover edges of N+ and P+ regions 119 and 121 to deposit a metal 122 such as ruthenium. Ru can be polished, and then salicidation can be executed, then stripped to make good connections. M5 and M6 pass transistors are not connected. Additional steps can be completed such as forming local interconnects on top, dummy gate removal, replacement metal gate and work function metals, gate cuts and dual damascene flow.

Figure 34:
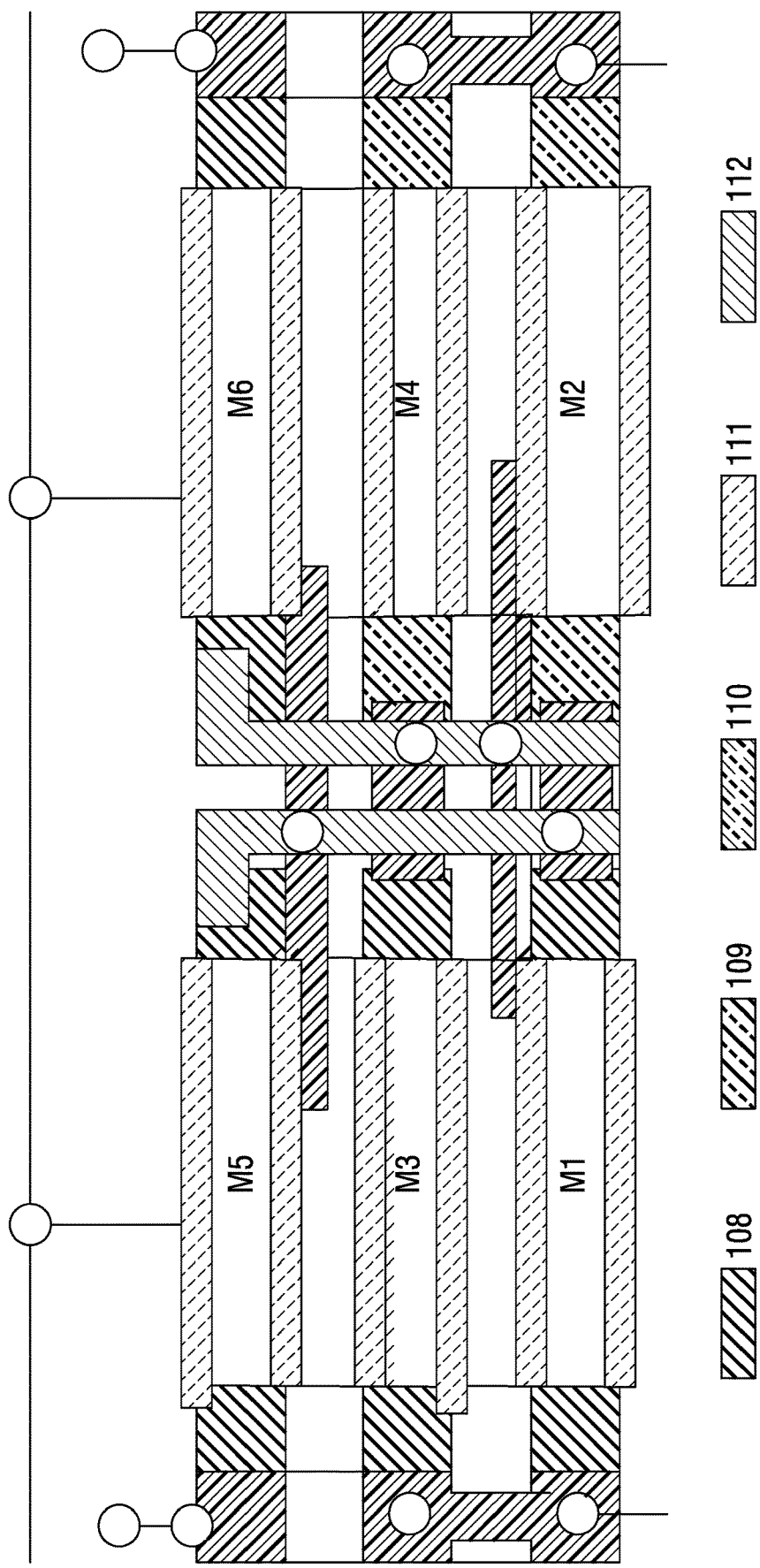

FIG. 34 shows local interconnect metal hook ups completed for a side-by-side 6T SRAM cell with access transistors positioned on a top of the stacks, and BIT lines connection (BL & BL) and word line connections on top of the stack with buried power rail connection for $V_{dd}$ and GND.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

The invention claimed is:

1. A circuit, comprising:
a substrate that has a front side opposite a backside;
a first layer of logic devices on the front side;
first memory devices on the front side;
a first wiring plane above the first layer of logic devices and the first memory devices;
a second wiring plane on the first wiring plane;
second memory devices above the second wiring plane; and
a second layer of logic devices above the second wiring plane.

2. The circuit of claim 1, further comprising:
a third wiring plane above the second memory devices and the second layer of logic devices.

3. The circuit of claim 1, wherein the first memory devices and the second memory devices include three-dimensional memory devices.

4. The circuit of claim 1, wherein the first and second wiring planes include one or multiple wiring planes.

5. The circuit of claim 1, wherein the logic devices include three-dimensional devices, stacked devices, or lateral gate-all-around devices.

6. The circuit of claim 1, wherein the first and second wiring planes include vias or contacts.

7. The circuit of claim 1, wherein the first memory devices are above the first layer of logic devices.

8. The circuit of claim 7, wherein the second layer of logic devices is above the second memory devices.

9. The circuit of claim 2, further comprising:
a fourth wiring plane on the third wiring plane;
a fourth layer of logic devices above the fourth wiring plane;
fourth memory devices above the fourth wiring plane;
a fifth wiring plane above the fourth layer of logic devices and the fourth memory devices;
a sixth wiring plane on the fifth wiring plane;
fifth memory devices above the sixth wiring plane;
a fifth layer of logic devices above the sixth wiring plane; and
a seventh wiring plane above the fifth memory devices and the fifth layer of logic devices.

10. A circuit, comprising:
a substrate that has a front side opposite a backside;
a first layer of memory devices and logic devices on the front side;
a first wiring plane above the first layer of memory devices and logic devices;
a second wiring plane on the first wiring plane;
a first plane of memory devices on the front side; and
a first layer of logic devices on the front side.

11. The circuit of claim 10, wherein the memory devices include three-dimensional memory devices.

12. The circuit of claim 10, wherein the first and second wiring planes include one or multiple wiring planes.

13. The circuit of claim 10, wherein the logic devices include three-dimensional devices, stacked devices, or lateral gate-all-around devices.

14. The circuit of claim 10, wherein the first and second wiring planes include vias or contacts.

15. The circuit of claim 10, further comprising:
a third wiring plane above the second wiring plane, the first plane of memory devices, and the first layer of logic devices.

16. The circuit of claim 10, wherein the first layer of logic devices is above the first plane of memory devices.

17. The circuit of claim 15, further comprising:
a fourth wiring plane on the third wiring plane;
a second layer of logic devices above the fourth wiring plane;
a second plane of memory devices above the fourth wiring plane;
a fifth wiring plane above the fourth wiring plane;
a sixth wiring plane on the fifth wiring plane;
a second layer of memory devices and logic devices above the fourth wiring plane; and
a seventh wiring plane above the second layer of memory devices and logic devices.

18. The circuit of claim 17, wherein the first layer of logic devices is above the first plane of memory devices, and the second plane of memory devices is above the second layer of logic devices.

19. A circuit, comprising:
a substrate that has a front side opposite a backside;
a first layer of memory devices and logic devices on the front side;
a first wiring plane above the first layer of memory devices and logic devices;
a second wiring plane on the first wiring plane; and
a second layer of memory devices and logic devices.

20. The circuit of claim 19, further comprising:
a third wiring plane above the second layer of memory devices and logic devices.

\* \* \* \* \*

UNITED STATES PATENT AND TRADEMARK OFFICE
CERTIFICATE OF CORRECTION

| | | |
|---|---|---|
| PATENT NO. | : 11,764,200 B2 | Page 1 of 1 |
| APPLICATION NO. | : 17/652864 | |
| DATED | : September 19, 2023 | |
| INVENTOR(S) | : Gardner et al. | |

It is certified that error appears in the above-identified patent and that said Letters Patent is hereby corrected as shown below:

On the Title Page

Item (57), under "ABSTRACT", Line 4, delete "devises" and insert -- devices --, therefor.

Signed and Sealed this
Sixth Day of February, 2024

*Katherine Kelly Vidal*

Katherine Kelly Vidal
*Director of the United States Patent and Trademark Office*